United States Patent
Xia et al.

(10) Patent No.: US 9,887,391 B2
(45) Date of Patent: Feb. 6, 2018

(54) OPTICAL MEMBER AND OLED DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Wanwan Xia, Shanghai (CN); Lijing Han, Shanghai (CN); Liyuan Luo, Shanghai (CN)

(73) Assignees: SHANGHAI TIANMA AM-OLED CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 62 days.

(21) Appl. No.: 14/722,056

(22) Filed: May 26, 2015

(65) Prior Publication Data
US 2016/0181573 A1    Jun. 23, 2016

(30) Foreign Application Priority Data
Dec. 23, 2014 (CN) .......................... 2014 1 0834468

(51) Int. Cl.
*G02B 5/30* (2006.01)
*H01L 51/52* (2006.01)

(52) U.S. Cl.
CPC ........ *H01L 51/5293* (2013.01); *G02B 5/3016* (2013.01); *G02B 5/3025* (2013.01); *G02B 5/3033* (2013.01); *G02B 5/3083* (2013.01); *H01L 51/5271* (2013.01)

(58) Field of Classification Search
CPC ... G02B 5/3083; G02B 5/3016; G02B 5/3025
USPC ........................................ 359/487.05
See application file for complete search history.

(56) References Cited

U.S. PATENT DOCUMENTS

| | | | |
|---|---|---|---|
| 6,788,370 B2* | 9/2004 | Itou | G02F 1/133555 257/59 |
| 7,379,243 B2* | 5/2008 | Horsten | G02B 5/08 359/320 |
| 2011/0222262 A1* | 9/2011 | Kawamoto | G02B 5/3033 362/19 |

FOREIGN PATENT DOCUMENTS

| | | |
|---|---|---|
| CN | 1595252 A | 3/2005 |
| CN | 101661950 A | 3/2010 |
| CN | 103869399 A | 6/2014 |
| KR | 20140064157 A * | 5/2014 |
| KR | 1020140064157 A | 5/2014 |

* cited by examiner

*Primary Examiner* — Thomas K Pham
*Assistant Examiner* — Mitchell Oestreich
(74) *Attorney, Agent, or Firm* — Anova Law Group, PLLC

(57) ABSTRACT

The invention discloses an optical member and an OLED display including an optical member. The optical member includes: a metal electrode, a λ/4 phase-difference plate and a linear polarization plate sequentially arranged in this order. A λ/2 phase-difference plate and a brightness enhancement film are arranged between the λ/4 phase-difference plate and the linear polarization plate; there is an angle between an absorption axis of the linear polarization plate and a polarization axis of the brightness enhancement film; and there is an angle between the polarization axis of the brightness enhancement film and a slow axis of the λ/2 phase-difference plate. This arrangement can address the problem in the related art that faces the difficulty to improve the transmittivity of light in an optical member in an OLED display.

15 Claims, 11 Drawing Sheets

OPTICAL MEMBER AND OLED DISPLAY DEVICE

CROSS-REFERENCES TO RELATED APPLICATIONS

This application claims the benefit of priority to Chinese Patent Application No. 201410834468.0, filed with the Chinese Patent Office on Dec. 23, 2014 and entitled "OPTICAL MEMBER AND OLED DISPLAY DEVICE", the content of which is incorporated herein by reference in its entirety.

BACKGROUND OF THE INVENTION

An optical member in an Organic Light-Emitting Diode (OLED) display device includes a linear polarization plate, and a λ/4 phase-difference plate, both of which primarily function as anti-reflection in the OLED display. For example, when natural light passes the linear polarization plate, the natural light parallel to an absorption axis of the linear polarization plate passes the linear polarization plate through a linear sheet, and the natural light perpendicular to the absorption axis of the linear polarization plate is shielded by the linear polarization plate; and after the natural light passing the linear polarization plate passes the λ/4 phase-difference plate, the natural light passing the λ/4 phase-difference plate will be turned into elliptically polarized light and circularly polarized light due to the π/2 phase delay between the azimuth of a fast axis and the azimuth of a slow axis of the λ/4 phase-difference plate; and if there is a 45° angle between the absorption axis of the linear polarization plate and the slow axis of the λ/4 phase-difference plate, as illustrated in FIG. 1, then after the natural light passes the linear polarization plate and the λ/4 phase-difference plate, the natural light will be turned into right-rotated circularly polarized light, and the right-rotated circularly polarized light will be turned into left-rotated circularly polarized light after being reflected on a metal electrode; and after the left-rotated circularly polarized light passes the λ/4 phase-difference plate, the left-rotated circularly polarized light will be turned into linearly polarized light which is perpendicular to the absorption axis of the linear polarization plate, and then the linearly polarized light cannot pass the linear polarization plate.

However, there are the following characteristics of the polarization sheet and the phase-difference plate in the OLED display in the related art:

The inverse wavelength diffusion characteristic of the single layer phase-difference plate tends to fail to agree with the ideal characteristic, as illustrated by the conventional QWF in FIG. 2, due to different phase compensations by the phase-difference plate for light in different wavelength bands, as denoted in Equation (1):

$$R_{te} = n_y d = (\theta/2\pi)\lambda \quad (1)$$

where $R_{te}$ represents a phase compensated in the direction of the slow axis; $\theta$ represents a compensation phase angle; and $n_y$ represents an in-plane refractive index in the direction of the slow axis.

It can be determined in Equation (1) that, if incident light is in a short wavelength band, then there will be a large phase compensation; and if the incident light is in a long wavelength band, then there will be a small phase compensation, as illustrated by the conventional QWF curve in FIG. 2. For the ideal value in FIG. 2, $R_{te}$ is in direct proportion to λ, and it can be apparent from Equation (1) that the compensation phase angle is same for different wavelength bands, so that light in all the wavelength bands will be completely absorbed by the optical member.

Both the linear polarization plate and the λ/4 phase-difference plate in the optical member are prepared for light at the 550 nm wavelength, that is, incident blue light at 550 nm can be completely absorbed by the optical member, but light in the other wavelength bands will be partially reflected, so that reflection cannot be completely cancelled. Reflectivities of predominant products in the market at present range between 2% and 6%.

The organic layer in the OLED device emits light with various phases, e.g., linearly polarized light, elliptically polarized light and circularly polarized light. If the absorption axis of the linear polarization plate in the optical member in the OLED display is parallel to the slow axis of the λ/4 phase-difference plate, and there is a 45° angle between the absorption axis of the linear polarization plate and an optical axis of the linear polarization plate, as illustrated in FIG. 3, then when the organic layer of the OLED device emits linearly polarized light, i.e., a light ray as illustrated in FIG. 3, the linearly polarized light is turned into right-rotated circularly polarized light after passing the λ/4 phase-difference plate for the first time, and when the right-rotated circularly polarized light passes the linear polarization plate, only a component P light parallel to the absorption axis of the linear polarization plate can pass and a component S perpendicular to the absorption axis of the linear polarization plate can not pass the linear polarization plate; here the P light refers to light perpendicular to the λ/4 phase-difference plate, and S light refers to the light parallel to the λ/4 phase-difference plate, and natural light can be regarded as the combination of these two components of light. When the organic layer of the OLED display emits circularly polarized light, i.e., b light ray as illustrated in FIG. 3, the circularly polarized light is turned into linearly polarized light after passing the λ/4 phase-difference plate for the first time, here the linearly polarized light is distributed in respective vibration directions, so only a part of the linearly polarized light can pass the linear polarization plate; and when the organic layer of the OLED display emits elliptically polarized light, i.e., c light ray as illustrated in FIG. 3, the elliptically polarized light is turned into linearly polarized light after passing the λ/4 phase-difference plate for the first time, here the linearly polarized light is distributed in respective vibration directions, so only a part of the linearly polarized light can pass the linear polarization plate. It can be determined from the analysis above, the light with the respective phases emitted from the organic layer in the OLED display will be at least attenuated to half in brightness after passing the optical member in the OLED display.

In summary, the optical member in the existing OLED display may suffer the problem of loss in transmitting light, hence it is difficult to improve the transmittivity of the light therein.

BRIEF SUMMARY OF THE INVENTION

In one aspect, the present disclosure provides an optical member and an OLED display so as to address the problem in the related art of the difficulty to improve the transmittivity of light in an optical member in an OLED display.

In another aspect, the present disclosure provides an optical member including a metal electrode, a λ/4 phase-difference plate and a linear polarization plate arranged in that order, wherein a λ/2 phase-difference plate and a brightness enhancement film are arranged between the λ/4 phase-difference plate and the linear polarization plate; there is an angle between an absorption axis of the linear polarization plate and a polarization axis of the brightness enhancement film; and there is an angle between the polarization axis of the brightness enhancement film and a slow axis of the λ/2 phase-difference plate.

In another aspect, the present disclosure further provides an OLED display including the above-described optical member.

As compared with the related art, a brightness enhancement film and a λ/2 phase-difference plate are added in the optical member, so that the brightness enhancement film and the λ/2 phase-difference plate can be varied in location between the λ/4 phase-difference plate and the linear polarization plate, and the angle between the absorption axis of the linear polarization plate and the polarization axis of the brightness enhancement film can be varied; and the transmittivity of light in the optical member can be improved over the related art.

Figure 1:
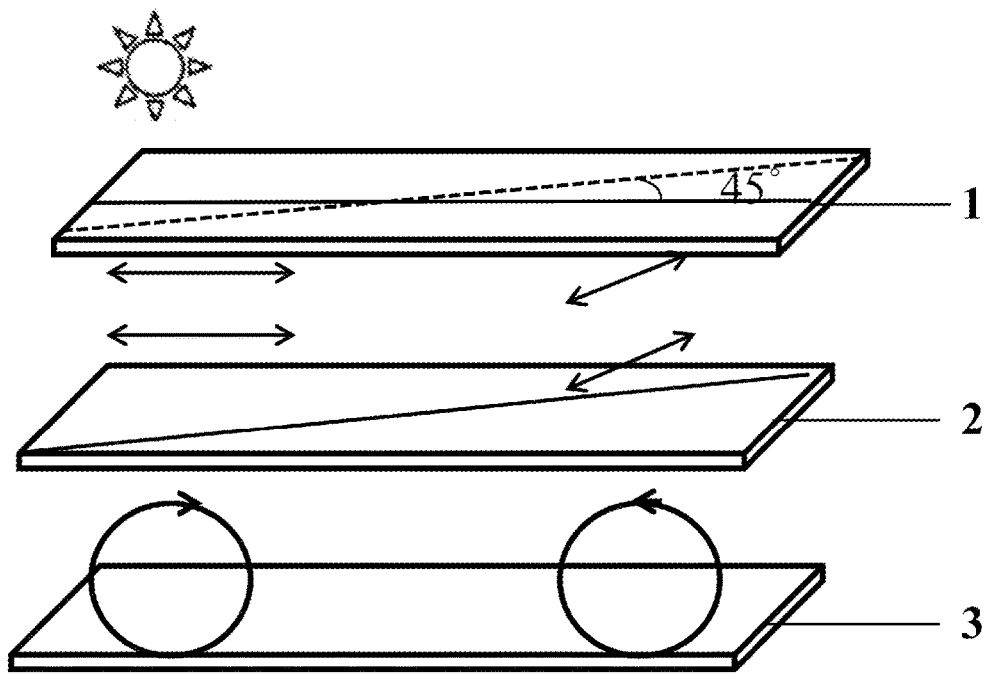
FIG. 1 illustrates a schematic diagram of components of an optical member in an OLED display in the related art.
Figure 2:
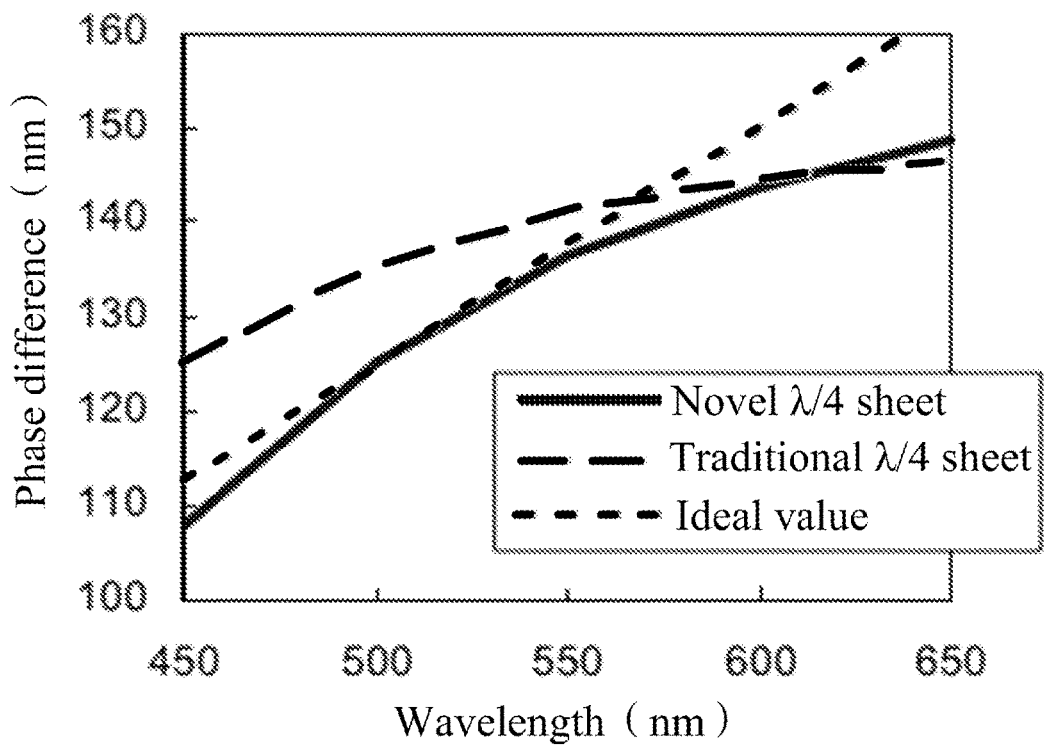
FIG. 2 is a graph illustrating an inverse wavelength diffusion characteristic of a single layer phase-difference plate in the related art.
Figure 3:
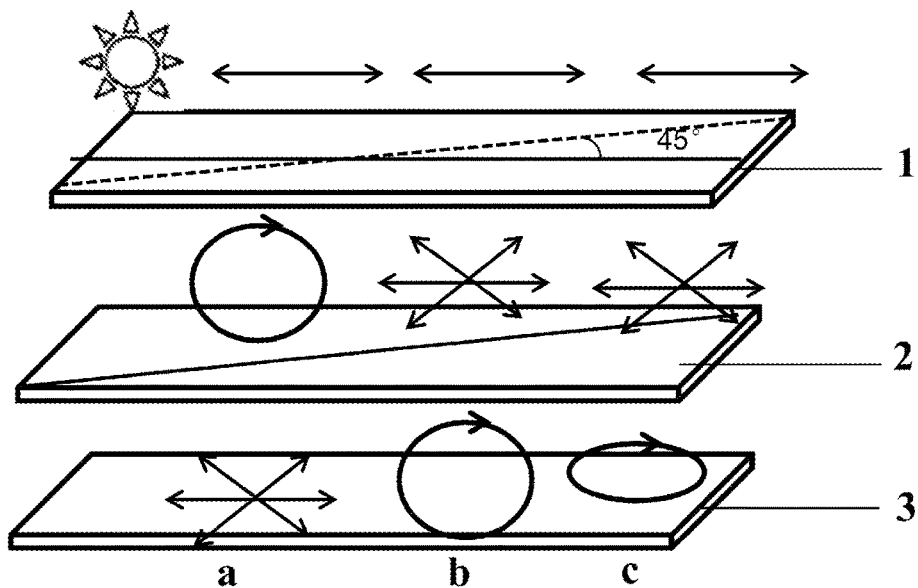
FIG. 3 illustrates a schematic diagram of a varying polarization state of linearly polarized light in the optical member of the OLED display, emitted from an organic layer of the OLED display in the related art.

In the drawings, 1 represents a linear polarization plate, 2 represents a λ/4 phase-difference plate, 3 represents a metal electrode, 4 represents a brightness enhancement film, and 5 represents a λ/2 phase-difference plate.

DETAILED DESCRIPTION OF THE INVENTION

An embodiment of the invention provides an optical member including a metal electrode, a λ/4 phase-difference plate and a linear polarization plate in that order, and a λ/2 phase-difference plate and a brightness enhancement film are arranged between the λ/4 phase-difference plate and the linear polarization plate; there is an angle between an absorption axis of the linear polarization plate and a polarization axis of the brightness enhancement film; and there is an angle between the direction of the polarization axis of the brightness enhancement film and a slow axis of the λ/2 phase-difference plate. As compared with the related art, the brightness enhancement film and the λ/2 phase-difference plate are added to this optical member, and locations of the brightness enhancement film and the λ/2 phase-difference plate between the λ/4 phase-difference plate and the linear polarization plate is variable, and the angle between the absorption axis of the linear polarization plate and the direction of the polarization axis of the brightness enhancement film is variable, so that the transmittivity of light in the optical member can be improved over the related art.

Preferred embodiments of the invention will be described below with reference to the drawings, and it shall be appreciated that the preferred embodiments described here are merely illustrative and not restrictive, and the embodiments of the invention and features of the embodiments can be combined with each other unless explicitly expressed otherwise.

First Embodiment

Figure 4:
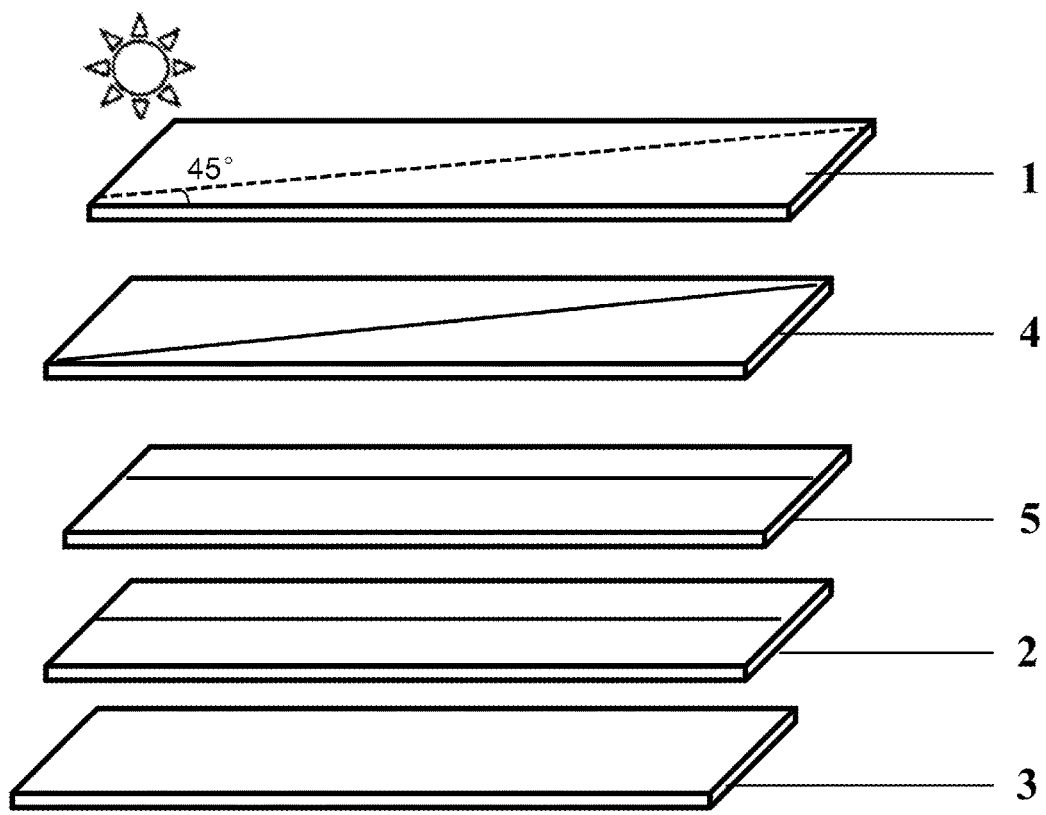
FIG. 4 illustrates a schematic diagram of an optical member according to a first embodiment of the invention.

A first embodiment of the invention provides an optical member as illustrated in FIG. 4 including an OLED organic light-emitting layer (not illustrated), a metal electrode, a λ/4 phase-difference plate and a linear polarization plate arranged in that order on the organic light-emitting layer, and a λ/2 phase-difference plate and a Brightness enhancement film (BEF) are arranged between the λ/4 phase-difference plate and the linear polarization plate. In the embodiments of the present invention, the Brightness enhancement film may be various types of brightness enhancement film, for example, a dual brightness enhancement film.

Furthermore, the λ/2 phase-difference plate is arranged between the λ/4 phase-difference plate and the brightness enhancement film.

The direction of an absorption axis of the linear polarization plate is parallel to the direction of a polarization axis of the brightness enhancement film, there is a 45° angle between the direction of the absorption axis of the linear polarization plate and a slow axis of the λ/2 phase-difference plate, and there is a 45° angle between the direction of the absorption axis of the linear polarization plate and a slow axis of the λ/4 phase-difference plate; and there is a 45° angle between the direction of the polarization axis of the brightness enhancement film and the slow axis of the λ/2 phase-difference plate, there is a 45° angle between the direction of the polarization axis of the brightness enhancement film and the slow axis of the λ/4 phase-difference plate, and the slow axis of the λ/2 phase-difference plate is parallel to the slow axis of the λ/4 phase-difference plate.

Figure 5:
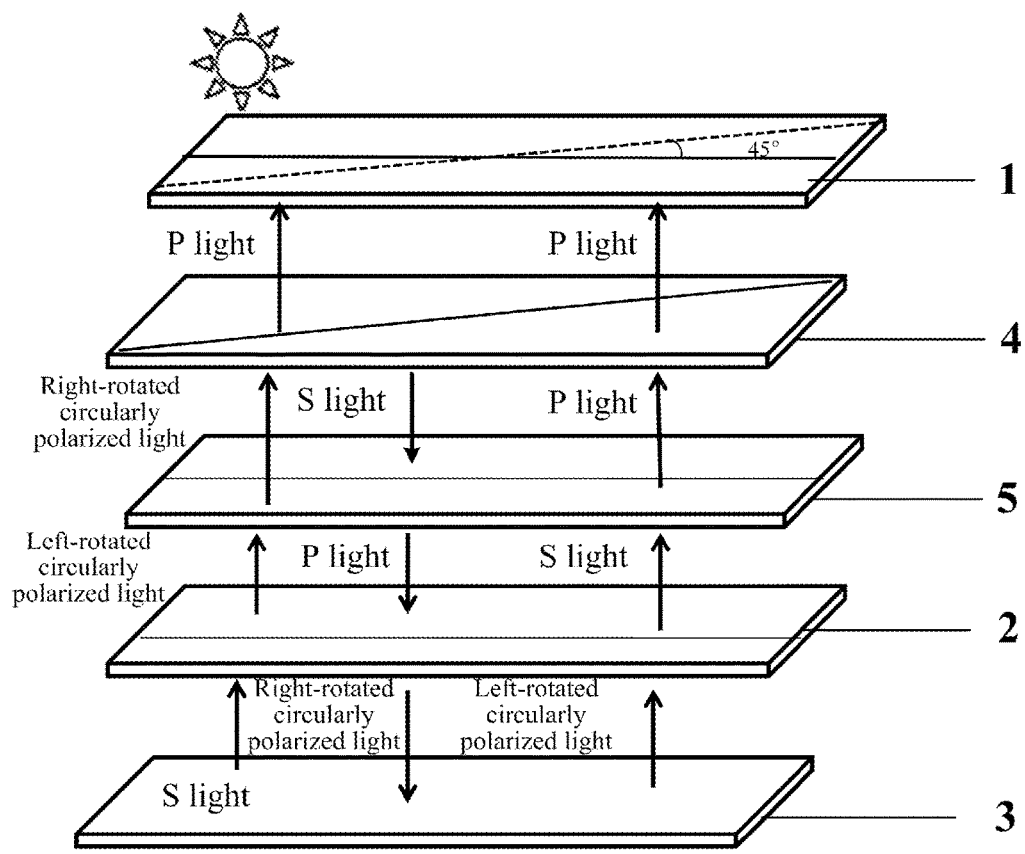
FIG. 5 illustrates a schematic diagram of a varying polarization state of S light in the optical member, perpendicular to an absorption axis of a linear polarization plate, emitted from an OLED organic light-emitting layer, according to the first embodiment of the invention.

A path of internal light passing the optical member will be described below with reference to FIG. 5 taking S light as an example, S light perpendicular to the absorption axis of the linear polarization plate is emitted from the OLED organic light-emitting layer.

In the first embodiment of the invention, light emitted from the OLED organic light-emitting layer is decomposed into P light parallel to the absorption axis of the linear polarization plate and S light perpendicular to the absorption axis of the linear polarization plate.

The S light will be described. Since the S light is perpendicular to the λ/4 phase-difference plate, the S light is turned into left-rotated circularly polarized light after passing the λ/4 phase-difference plate; since the slow axis of the λ/4 phase-difference plate is parallel to the slow axis of the λ/2 phase-difference plate, the left-rotated circularly polarized light is turned into right-rotated circularly polarized light after passing the λ/2 phase-difference plate. Since there is the 45° angle between the direction of the polarization axis of the brightness enhancement film and the slow axis of the λ/2 phase-difference plate, P light among the right-rotated circularly polarized light is parallel to the direction of the polarization axis of the brightness enhancement film and S light among the right-rotated circularly polarized light is perpendicular to the direction of the polarization axis of the brightness enhancement film, thus the P light among the right-rotated circularly polarized light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the first time to the outside will be defined as primary P light.

Furthermore, since the S light among the right-rotated circularly polarized light is perpendicular to the direction of the polarization axis of the brightness enhancement film, the S light is reflected by the brightness enhancement film, the reflected S light propagates along a reversed route to the original route, the S light propagating in the reversed route passes the λ/2 phase-difference plate, and the S light is turned into P light after passing the λ/2 phase-difference plate due to the 45° angle between the slow axis of the λ/2 phase-difference plate and the absorption axis of the linear polarization plate; since the slow axis of the λ/2 phase-difference plate is parallel to the slow axis of the λ/4 phase-difference plate, the P light is turned into right-rotated circularly polarized light after passing the λ/4 phase-difference plate; the right-rotated circularly polarized light passing the surface of the metal electrode is reflected by the metal electrode into left-rotated circularly polarized light; the left-rotated circularly polarized light is turned into S light after passing the λ/4 phase-difference plate; since the slow axis of the λ/2 phase-difference plate is parallel to the slow axis of the λ/4 phase-difference plate, the S light is turned into P light after passing the λ/2 phase-difference plate; since the P light is parallel to the direction of the polarization axis of the brightness enhancement film, the P light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the second time to the outside will be defined as secondary P light.

Figure 6:
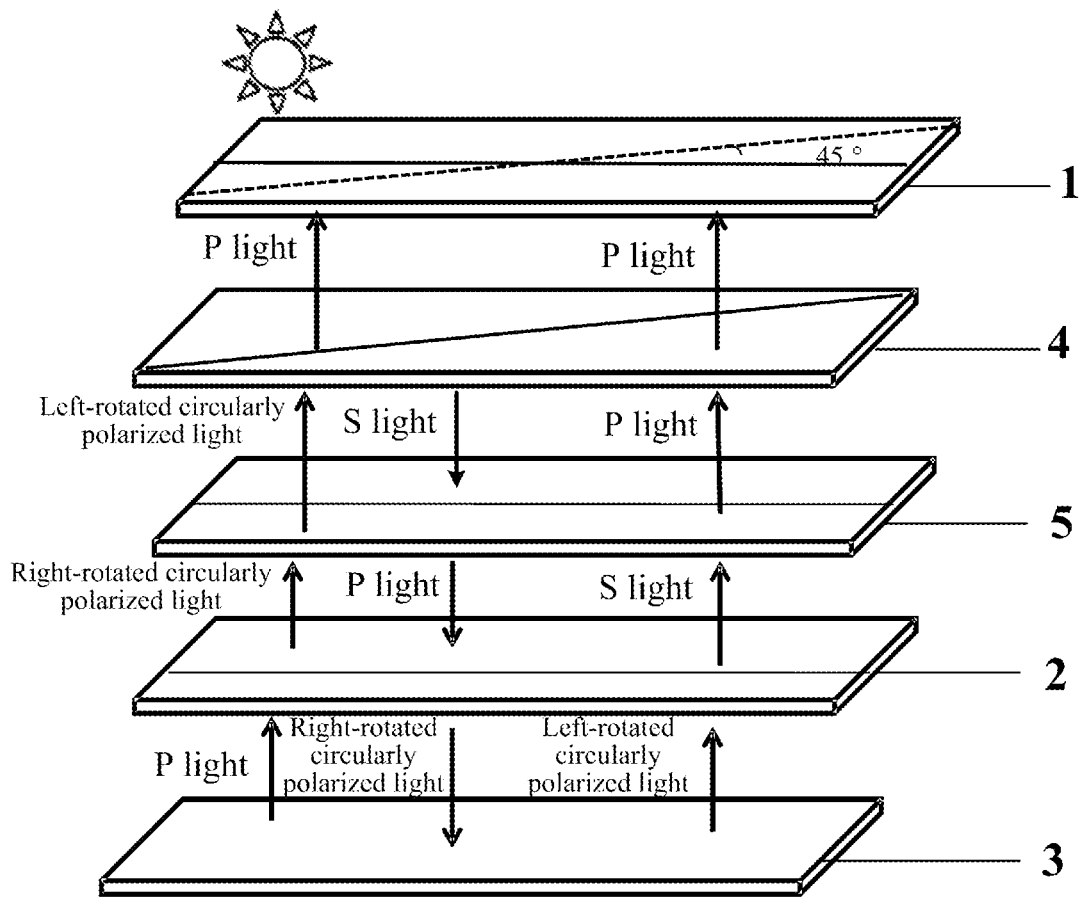
FIG. 6 illustrates a schematic diagram of a varying polarization state of P light in the optical member, parallel to the absorption axis of the linear polarization plate, emitted from the OLED organic light-emitting layer, according to the first embodiment of the invention.

A path of internal light passing the optical member will be described below with reference to FIG. 6 taking P light as an example, the P light parallel to the absorption axis of the linear polarization plate is emitted from the OLED organic light-emitting layer.

The P light will be described. Since the P light is parallel to the λ/4 phase-difference plate, the P light is turned into right-rotated circularly polarized light after passing the λ/4 phase-difference plate; since the slow axis of the λ/4 phase-difference plate is parallel to the slow axis of the λ/2 phase-difference plate, the right-rotated circularly polarized light is turned into left-rotated circularly polarized light after passing the λ/2 phase-difference plate; since there is the 45° angle between the direction of the polarization axis of the brightness enhancement film and the slow axis of the λ/2 phase-difference plate, P light among the left-rotated circularly polarized light is parallel to the direction of the polarization axis of the brightness enhancement film and S light among the left-rotated circularly polarized light is perpendicular to the direction of the polarization axis of the brightness enhancement film, thus the P light among the left-rotated circularly polarized light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the first time to the outside will be defined as primary P light.

Furthermore, since the S light among the left-rotated circularly polarized light is perpendicular to the direction of the polarization axis of the brightness enhancement film, the S light is reflected by the brightness enhancement film. The reflected S light propagates along a reversed route to the original route, the S light propagating in the reversed route passes the λ/2 phase-difference plate, and the S light is turned into P light after passing the λ/2 phase-difference plate due to the 45° angle between the slow axis of the λ/2 phase-difference plate and the absorption axis of the linear polarization plate; since the slow axis of the λ/2 phase-difference plate is parallel to the slow axis of the λ/4 phase-difference plate, the P light is turned into right-rotated circularly polarized light after passing the λ/4 phase-difference plate; the right-rotated circularly polarized light passing the surface of the metal electrode is reflected by the metal electrode into left-rotated circularly polarized light; the left-rotated circularly polarized light is turned into S light after passing the λ/4 phase-difference plate; since the slow axis of the λ/2 phase-difference plate is parallel to the slow axis of the λ/4 phase-difference plate, the S light is turned into P light after passing the λ/2 phase-difference plate; since the P light is parallel to the direction of the polarization axis of the brightness enhancement film, the P light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the second time to the outside will be defined as secondary P light.

In the embodiment of the invention, optical transmittivities and reflectivities in the embodiment of the invention will be described taking as an example that a optical transmittivity of the λ/2 phase-difference plate is 95%, an optical transmittivity of the λ/4 phase-difference plate is 98%, a reflectivity of the metal electrode is 40%, a transmittivity of the linear polarization plate is 98%, and an optical transmittivity of the brightness enhancement film is 48% and a reflectivity of the brightness enhancement film is 48%. However in a real application, optical absorptivities of the λ/2 phase-difference plate, the λ/4 phase-difference plate, the brightness enhancement film and the linear polarization plate will not be limited; and furthermore the reflectivity and the transmittivity of the brightness enhancement film will not be limited either on the condition that the sum of the optical absorptivity, reflectivity and transmittivity of the brightness enhancement film are 1; and the reflectivity of the metal electrode will not be limited.

When there is no brightness enhancement film in the optical member, firstly the output amount of light from the optical member will be described taking as an example P light emitted from the OLED organic light-emitting layer. For the sake of a clear description, the light emitted from the OLED organic light-emitting layer is decomposed into P light defined as original P light. Since the original P light is parallel to the λ/4 phase-difference plate with the 98% transmittivity, when the original P light is turned into right-rotated circularly polarized light after passing the λ/4 phase-difference plate, the output amount of right-rotated circularly polarized light is 98% of the original P light; since the slow axis of the λ/4 phase-difference plate is parallel to the slow axis of the λ/2 phase-difference plate with the 95% transmittivity, when the right-rotated circularly polarized light is turned into left-rotated circularly polarized light after passing the λ/2 phase-difference plate, the output amount of left-rotated circularly polarized light is 98%*95% of the original P light. Since there is no brightness enhancement film in the optical member, the left-rotated circularly polarized light transmitted from the λ/2 phase-difference plate will reach directly the linear polarization plate; since there is the 45° angle between the absorption axis of the linear polarization plate and the slow axis of the λ/2 phase-difference plate, P light among the left-rotated circularly polarized light is parallel to the absorption axis of the linear polarization plate and S light among the left-rotated circularly polarized light is perpendicular to the absorption axis of the linear polarization plate, the P light among the left-rotated circularly polarized light can pass smoothly the linear polarization plate to the outside; and since the S light among the left-rotated circularly polarized light does not pass the linear polarization plate, only a half of the left-rotated circularly polarized light is transmitted through the linear polarization plate with the 2% optical absorption, and thus the output amount of light from the optical member is 98%*95%*49%=45.6% of the original P light.

Secondly the output amount of light from the optical member will be described taking as an example S light emitted from the OLED organic light-emitting layer. For the sake of a clear description, the light emitted from the OLED organic light-emitting layer is decomposed into S light defined as original S light. Since there is the 45° angle between the S light and the slow axis of the λ/4 phase-difference plate and the λ/4 phase-difference plate has the 98% transmittivity, the S light is turned into left-rotated circularly polarized light after passing the λ/4 phase-difference plate, the transmitted amount of left-rotated circularly polarized light is 98% of the original S light; since the slow axis of the λ/4 phase-difference plate is parallel to the slow axis of the λ/2 phase-difference plate with the 95% transmittivity, the left-rotated circularly polarized light is turned into right-rotated circularly polarized light, the output amount of which is 98%*95% of the original S light, after passing the λ/2 phase-difference plate; since there is no the brightness enhancement film in the optical member, the right-rotated circularly polarized light transmitted from the λ/2 phase-difference plate will reach directly the linear polarization plate; since there is the 45° angle between the absorption axis of the linear polarization plate and the slow axis of the λ/2 phase-difference plate, P light among the right-rotated circularly polarized light is parallel to the absorption axis of the linear polarization plate and S light among the right-rotated circularly polarized light is perpendicular to the absorption axis of the linear polarization plate, thus the P light among the right-rotated circularly polarized light can pass smoothly the linear polarization plate to the outside; and since the S light among the right-rotated circularly polarized light does not pass the linear polarization plate, only a half of the right-rotated circularly polarized light is transmitted through the linear polarization plate with the 2% optical absorption, and thus the output amount of light from the optical member is 98%*95%*49%=45.6% of the original S light.

It can be determined from the analysis above that if the brightness enhancement film is not added to the optical member, and the light emitted from the optical member is decomposed into P light and S light, then the output amount of either the P light or the S light after passing the optical member to which the brightness enhancement film is not added is 98%*95%*49%=45.6%.

In the embodiment of the invention, the brightness enhancement film is added to the optical member. Firstly the output amount of light from the optical member will be described taking as an example P light, parallel to the absorption axis of the linear polarization plate, emitted from the OLED organic light-emitting layer; and for the sake of a clear description, the light emitted from the OLED organic light-emitting layer is decomposed into P light defined as original P light.

Since the original P light is parallel to the λ/4 phase-difference plate with the 98% transmittivity, the original P light is turned into right-rotated circularly polarized light, the transmitted amount of which is 98% of the original P light, after passing the λ/4 phase-difference plate; since the slow axis of the λ/4 phase-difference plate is parallel to the slow axis of the λ/2 phase-difference plate with the 95% transmittivity, the right-rotated circularly polarized light is turned into left-rotated circularly polarized light, the output amount of which is 98%*95% of the original P light, after passing the λ/2 phase-difference plate. In the embodiment of the invention, the brightness enhancement film is added to the optical member, and there is a 45° angle between the direction of the polarization axis of the brightness enhancement film and the slow axis of the λ/2 phase-difference plate. Since S light among the left-rotated circularly polarized light is perpendicular to the direction of the polarization axis of the brightness enhancement film, and P light among the left-rotated circularly polarized light is parallel to the direction of the polarization axis of the brightness enhancement film, thus the P light among the left-rotated circularly polarized light can pass smoothly the brightness enhancement film, and since the 48% transmittivity of the brightness enhancement film, the output amount of the P light passing the brightness enhancement film is 98%*95%*48% of the original P light; and since the direction of the absorption axis of the linear polarization plate is parallel to the direction of the polarization axis of the brightness enhancement film, the P light transmitted through the brightness enhancement film can pass smoothly the linear polarization plate, and since the 98% transmittivity of the linear polarization plate, the output amount of the P light passing the linear polarization plate to the outside is 98%*95%*48%*98% of the original P light. In the embodiment of the invention, the P light passing the linear polarization plate for the first time will be defined as primary P light, of which the output amount is 98%*95%*48%*98%=43.8% of the original P light.

Furthermore since the S light among the left-rotated circularly polarized light is perpendicular to the direction of the polarization axis of the brightness enhancement film, the S light among the left-rotated circularly polarized light is reflected by the brightness enhancement film, the reflected S light propagates along a reversed route to the original propagation route, and since the reflectivity 48% of the brightness enhancement film, the output amount of the reflected S light is 98%*95%*48% of the original P light; the S light passes the λ/2 phase-difference plate, and the S light is turned into P light, the output amount of which is 98%*95%*48%*95% of the original P light, after passing the λ/2 phase-difference plate due to the 45° angle between the slow axis of the λ/2 phase-difference plate and the direction of the absorption axis of the linear polarization plate, and with the 95% transmittivity of the λ/2 phase-difference plate; since the slow axis of the λ/2 phase-difference plate is parallel to the slow axis of the λ/4 phase-difference plate, and the transmittivity of the λ/4 phase-difference plate is 98%, the P light is turned into right-rotated circularly polarized light, the output amount of which is 98%*95%*48%*95%*98% of the original P light, after passing the λ/4 phase-difference plate; the right-rotated circularly polarized light passing the surface of the metal electrode is reflected by the metal electrode into left-rotated circularly polarized light, and since the reflectivity of the metal electrode is 40%, the output amount of the left-rotated circularly polarized light is 98%*95%*48%*95%*98%*40% of the original P light; the left-rotated circularly polarized light is turned into S light after passing the λ/4 phase-difference plate, and since the transmittivity of the λ/4 phase-difference plate is 98%, the output amount of the S light is 98%*95%*48%*95%*98%*40%*98% of the original P light; since the slow axis of the λ/2 phase-difference plate is parallel to the slow axis of the λ/4 phase-difference plate, and the transmittivity of the λ/2 phase-difference plate is 95%, the S light is turned into P light, the output amount of which is 98%*95%*48%*95%*98%*40%*98%*95% of the original P light, after passing the λ/2 phase-difference plate; since the P light is parallel to the direction of the polarization axis of the brightness enhancement film with the 96% transmittivity, the output amount of the P light passing the brightness enhancement film is 98%*95%*48%*95%*98%*40%*98%*95%*96% of the original P light; and since the direction of the absorption axis of the linear polarization plate is parallel to the direction of the polarization axis of the brightness enhancement film, the P light can pass smoothly the linear polarization plate to the outside, and thus the output amount of the P light passing the linear polarization plate is 98%*95%*48%*95%*98%*40%*98%*95%*96% of the original P light. In the embodiment of the invention, the P light passing the linear polarization plate for the second time will be defined as secondary P light, the output amount of which is 98%*95%*48%*95%*98%*40%*98%*95%*96%*98%=14.5% of the original P light.

Secondly the output amount of light from the optical member will be described taking as an example S light, perpendicular to the absorption axis of the linear polarization plate, emitted from the OLED organic light-emitting layer; and for the sake of a clear description, the light emitted from the OLED organic light-emitting layer is decomposed into S light defined as original S light.

Since the original S light is perpendicular to the λ/4 phase-difference plate with the 98% transmittivity, the original S light is turned into left-rotated circularly polarized light, the output amount of which is 98% of the original S light, after passing the λ/4 phase-difference plate; since the slow axis of the λ/4 phase-difference plate is parallel to the slow axis of the λ/2 phase-difference plate with the 95% transmittivity, the left-rotated circularly polarized light is turned into right-rotated circularly polarized light, the output amount of which is 98%*95% of the original S light, after passing the λ/2 phase-difference plate. In the embodiment of the invention, the brightness enhancement film is added to the optical member, and there is a 45° angle between the direction of the polarization axis of the brightness enhancement film and the slow axis of the λ/2 phase-difference plate, and since S light among the right-rotated circularly polarized light is perpendicular to the direction of the polarization axis of the brightness enhancement film and P light among the right-rotated circularly polarized light is parallel to the direction of the polarization axis of the brightness enhancement film, the P light among the right-rotated circularly polarized light can pass smoothly the brightness enhancement film, and since the transmittivity of the brightness enhancement film is 48%, the output amount of the P light passing the brightness enhancement film is 98%*95%*48% of the original S light; and since the direction of the absorption axis of the linear polarization plate is parallel to the direction of the polarization axis of the brightness enhancement film, the P light transmitted through the brightness enhancement film can pass smoothly the linear polarization plate, and since the transmittivity of the linear polarization plate is 98%, the output amount of the P light passing the linear polarization plate to the outside is 98%*95%*48%*98% of the original S light. In the embodiment of the invention, the P light passing the linear polarization plate for the first time will be defined as primary P light, of which the output amount is 98%*95%*48%*98%=43.8% of the original S light.

Furthermore since the S light among the right-rotated circularly polarized light is perpendicular to the direction of the polarization axis of the brightness enhancement film, the S light among the right-rotated circularly polarized light is reflected by the brightness enhancement film, the reflected S light propagates along a reversed route to the original propagation route, and since the reflectivity of the brightness enhancement film is 48%, the output amount of the reflected S light is 98%*95%*48% of the original S light; the S light passes the λ/2 phase-difference plate, and the S light is turned into P light, the output amount of which is 98%*95%*48%*95% of the original S light, after passing the λ/2 phase-difference plate due to the 45° angle between the slow axis of the λ/2 phase-difference plate and the direction of the absorption axis of the linear polarization plate and with the 95% transmittivity of the λ/2 phase-difference plate; since the slow axis of the λ/2 phase-difference plate is parallel to the slow axis of the λ/4 phase-difference plate, and the transmittivity of the λ/4 phase-difference plate is 98%, the P light is turned into right-rotated circularly polarized light, the output amount of which is 98%*95%*48%*95%*98% of the original S light, after passing the λ/4 phase-difference plate; the right-rotated circularly polarized light passing the surface of the metal electrode is reflected by the metal electrode into left-rotated circularly polarized light, and since the transmittivity of the metal electrode is 40%, the output amount of the left-rotated circularly polarized light is 98%*95%*48%*95%*98%*40% of the original S light; the left-rotated circularly polarized light is turned into S light after passing the λ/4 phase-difference plate again, and since the transmittivity of the λ/4 phase-difference plate is 98%, the output amount of the S light is 98%*95%*48%*95%*98%*40%*98% of the original S light; since the slow axis of the λ/2 phase-difference plate is parallel to the slow axis of the λ/4 phase-difference plate, and the transmittivity of the λ/2 phase-difference plate is 95%, the S light is turned into P light, the output amount of which is 98%*95%*48%*95%*98%*40%*98%*95% of the original S light, after passing the λ/2 phase-difference plate; since the P light is parallel to the direction of the polarization axis of the brightness enhancement film with the 96% transmittivity, the output amount of the P light passing the brightness enhancement film is 98%*95%*48%*95%*98%*40%*98%*95%*96% of the original S light; and since the direction of the absorption axis of the linear polarization plate is parallel to the direction of the polarization axis of the brightness enhancement film, the P light can pass smoothly the linear polarization plate to the outside, and since the transmittivity of the linear polarization plate is 98%, the output amount of the P light passing the linear polarization plate is 98%*95%*48%*95% *98%*40%*98%*95%*96% *98% of the original S light. In the embodiment of the invention, the P light passing the linear polarization plate for the second time will be defined as secondary P light, the output amount of which is 98%*95%*48%*95%*98%*40%*98%*95% *96%*98%= 14.5% of the original S light.

It can be determined from the analysis above that with the brightness enhancement film added to the optical member, the light emitted from the optical member is decomposed into P light and S light, and the output amount of either the P light or the S light after passing the optical member according to the first embodiment of the invention is the sum of the output amount of the primary P light and the output amount of the secondary P light, i.e., 98%*95%*48%*98%+ 98%*95%*48%*95%*98%*40%*98%*95%*96%*98%= 58.3%.

The light emitted from the optical member is decomposed into P light and S light, and the total output amount of either the P light or the S light after passing the optical member according to the first embodiment of the invention reaches 58.3%; and with the brightness enhancement film not added to the optical member, the total output amount of either the P light or the S light, into which the light emitted from the optical member is decomposed, after passing the optical member to which the brightness enhancement film is not added is 45.6%. Based on the data above, the output amount of light from the optical member according to the first embodiment of the invention can be determined larger by a factor of 27.9% than the output amount of light from the optical member to which the brightness enhancement film is not added.

Figure 7:
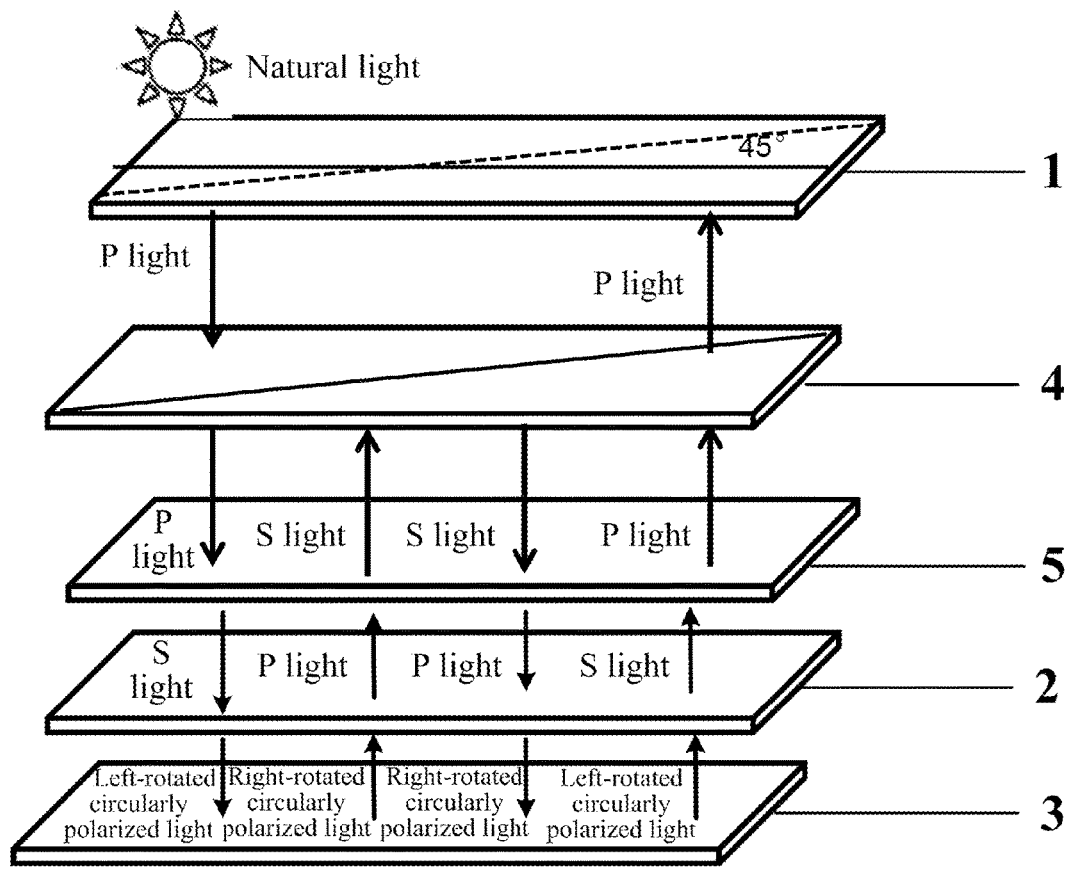
FIG. 7 illustrates a schematic diagram of a varying polarization state of outside natural light in the optical member according to the first embodiment of the invention.

A path of outside natural light being reflected will be described below with reference to FIG. 7.

After natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate; since the absorption axis of the linear polarization plate is parallel to the direction of the polarization axis of the brightness enhancement film, the P light passing the linear polarization plate passes the λ/2 phase-difference plate through the polarization axis of the brightness enhancement film, and the P light is turned into S light after passing the λ/2 phase-difference plate due to the 45° angle between the direction of the absorption axis of the linear polarization plate and the slow axis of the λ/2 phase-difference plate, i.e., the 45° angle between the direction of the polarization axis of the brightness enhancement film and the slow axis of the λ/2 phase-difference plate; since the slow axis of the λ/2 phase-difference plate is parallel to the slow axis of the λ/4 phase-difference plate, the S light is turned into left-rotated circularly polarized light after passing the λ/4 phase-difference plate; the left-rotated circularly polarized light is reflected by the metal electrode into right-rotated circularly polarized light when passing the metal electrode layer; the right-rotated circularly polarized light is turned into P light after passing the λ/4 phase-difference plate; since the slow axis of the λ/2 phase-difference plate is parallel to the slow axis of the λ/4 phase-difference plate, the P light is turned into S light after passing the λ/2 phase-difference plate; and the S light can not pass the brightness enhancement film but is reflected by the brightness enhancement film due to the 45° angle between the direction of the polarization axis of the brightness enhancement film and the slow axis of the λ/2 phase-difference plate, the reflected S light propagates along a reversed route to the original propagation route, and the S light is turned into P light after passing the λ/2 phase-difference plate; since the slow axis of the λ/2 phase-difference plate is parallel to the slow axis of the λ/4 phase-difference plate, the P light is turned into right-rotated circularly polarized light after passing the λ/4 phase-difference plate; the right-rotated circularly polarized light is reflected by the metal electrode into left-rotated circularly polarized light when passing the metal electrode layer, the reflected left-rotated circularly polarized light propagates along a reversed route to the original propagation route, and the left-rotated circularly polarized light is turned into S light after passing the λ/4 phase-difference plate; since the slow axis of the λ/2 phase-difference plate is parallel to the slow axis of the λ/4 phase-difference plate, the S light is turned into P light after passing the λ/2 phase-difference plate; the P light can pass smoothly the brightness enhancement film due to the 45° angle between the direction of the polarization axis of the brightness enhancement film and the slow axis of the λ/2 phase-difference plate; and since the absorption axis of the linear polarization plate is parallel to the direction of the polarization axis of the brightness enhancement film, the P light passes directly the linear polarization plate to the outside after passing the brightness enhancement film.

In the embodiment of the invention, the brightness enhancement film is added to the optical member, and the reflected amount of light from the outside passing through the optical member will be described below taking natural light as an example. After natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate, and since the transmittivity of the linear polarization plate is 98%, the output amount of the P light passing the linear polarization plate is 98% of the natural light; since the absorption axis of the linear polarization plate is parallel to the direction of the polarization axis of the brightness enhancement film, the P light passing the linear polarization plate passes the direction of the polarization axis of the brightness enhancement film, and since the optical absorptivity of the brightness enhancement film is 4%, the output amount of the P light passing the brightness enhancement film is 98%*96% of the natural light, and the P light is turned into S light, the output amount of which is 98%*96%*95% of the natural light, after passing the λ/2 phase-difference plate due to the 45° angle between the direction of the absorption axis of the linear polarization plate and the slow axis of the λ/2 phase-difference plate, i.e., the 45° angle between the direction of the polarization axis of the brightness enhancement film and the slow axis of the λ/2 phase-difference plate, and with the 95% transmittivity of the λ/2 phase-difference plate; since the slow axis of the λ/2 phase-difference plate is parallel to the slow axis of the λ/4 phase-difference plate, and the transmittivity of the λ/4 phase-difference plate is 98%, the S light is turned into left-rotated circularly polarized light after passing the λ/4 phase-difference plate; the output amount of the left-rotated circularly polarized light is 98%*96%*95%*98% of the natural light; the left-rotated circularly polarized light is reflected by the metal electrode into right-rotated circularly polarized light after passing the metal electrode layer; since the reflectivity of the metal electrode is 40%, the output amount of the right-rotated circularly polarized light is 98%*96%*95%*98%*40% of the natural light; the right-rotated circularly polarized light is turned into P light after passing the λ/4 phase-difference plate, and since the transmittivity of the λ/4 phase-difference plate is 98%, the output amount of the P light is 98%*96%*95%*98%*40%*98% of the natural light; since the slow axis of the λ/2 phase-difference plate is parallel to the slow axis of the λ/4 phase-difference plate, and the transmittivity of the λ/2 phase-difference plate is 95%, the P light is turned into S light, the output amount of which is 98%*96%*95%*98%*40%*98%*95% of the natural light, after passing the λ/2 phase-difference plate; the S light can not pass the brightness enhancement film but is reflected by the brightness enhancement film due to the 45° angle between the direction of the polarization axis of the brightness enhancement film and the slow axis of the λ/2 phase-difference plate, the reflected S light propagates along a reversed route to the original propagation route, and since the transmittivity of the brightness enhancement film is 48%, the output amount of the reflected S light is 98%*96%*95%*98%*40%*98%*95%*48% of the natural light; the S light is turned into P light after passing the λ/2 phase-difference plate, and since the transmittivity of the λ/2 phase-difference plate is 95%, the output amount of the P light is 98%*96%*95%*98%*40%*98%*95%*48%*95% of the natural light; since the slow axis of the λ/2 phase-difference plate is parallel to the slow axis of the λ/4 phase-difference plate, and the transmittivity of the λ/4 phase-difference plate is 98%, the P light is turned into right-rotated circularly polarized light after passing the λ/4 phase-difference plate; the output amount of the right-rotated circularly polarized light is 98%*96%*95%*98%*40%*98%*95%*48%*95%*98% of the natural light; the right-rotated circularly polarized light is reflected by the metal electrode into left-rotated circularly polarized light after passing the metal electrode layer, the reflected left-rotated circularly polarized light propagates along a reversed route to the original propagation route, and since the reflectivity of the metal electrode is 40%, the output amount of the left-rotated circularly polarized light is 98%*96%*95%*98%*40%*98%*95%*48%*95%*98%*40% of the natural light; the left-rotated circularly polarized light is turned into S light after passing the λ/4 phase-difference plate, and since the transmittivity of the λ/4 phase-difference plate is 98%, the output amount of the S light is 98%*96%*95%*98%*40%*98%*95%*48%*95%*98%*40%*98% of the natural light; since the slow axis of the λ/2 phase-difference plate is parallel to the slow axis of the λ/4 phase-difference plate, the S light is turned into P light after passing the λ/2 phase-difference plate, and since the transmittivity of the λ/2 phase-difference plate is 95%, the output amount of the P light is 98%*96%*95%*98%*40%*98%*95%*48%*95%*98%*40%*98%*95% of the natural light; since there is the 45° angle between the direction of the polarization axis of the brightness enhancement film and the slow axis of the λ/2 phase-difference plate, the absorption axis of the linear polarization plate is parallel to the direction of the polarization axis of the brightness enhancement film, and the optical transmittivity of the brightness enhancement film is 96%, and the transmittivity of the linear polarization plate is 98%, thus the output amount of the P light passing the linear polarization plate is 98%*96%*95%*98%*40%*98%*95%*48%*95%*98%*40%*98%*95%*98%=5.3% of the natural light.

It can be determined from the analysis above that with the brightness enhancement film added to the optical member, the output amount (reflectivity) of the outside natural light can reach approximately 5.3%, whereas in the related art, with the brightness enhancement film not added to the optical member, the output amount (reflectivity) of the outside natural light is approximately 4%, so the output amount of light in the embodiment of the invention is larger than the output amount of light in the related art by a factor of approximately 20%.

In the first embodiment of the invention, the total output amount of light from the optical member to which the brightness enhancement film is added can reach 58.3% due to the brightness enhancement film added to the optical member, and the output amount (reflectivity) of the outside natural light can reach at most 5.3%; and with the brightness enhancement film not added to the optical member, the total output amount of light of either the P light or the S light, into which the light emitted from the optical member is decomposed, after passing the optical member to which the brightness enhancement film is not added is 45.2%, and the output amount (reflectivity) of the outside natural light is approximately 4%, so the output amount of light from the optical member according to the first embodiment of the invention can be larger than the related art by a factor of 22.5% while guaranteeing a low output amount (reflectivity) of the outside natural light.

A contrast ratio is one of criteria to define how clear a product appears under ambient light, and the contrast ratio may be defined as the ratio of brightness to an average reflectivity. Since the output amount of light from the optical member according to the first embodiment of the invention is larger than the related art by a factor of 27.9% while the output amount (reflectivity) of the outside natural light is larger by a factor of approximately 20%, the contrast ratio of the optical member according to the first embodiment of the invention is larger than the contrast ratio in the related art by a factor of 27.9%*/20%=1.39.

Figure 8:
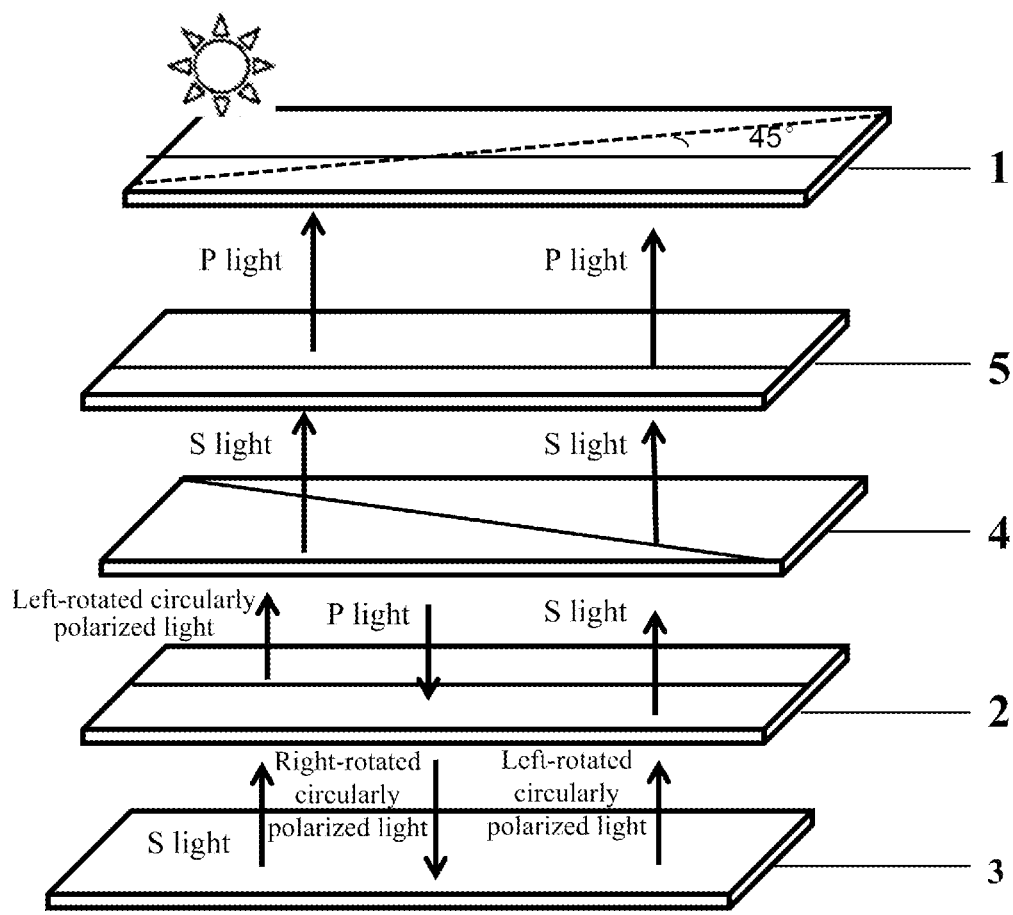
FIG. 8 illustrates a schematic diagram of a varying polarization state of S light in the optical member, perpendicular to then absorption axis of the linear polarization plate, emitted from the OLED organic light-emitting layer, according to another embodiment of the invention.

Another embodiment of the invention provides an optical member as illustrated in FIG. 8 including an OLED organic light-emitting layer (not illustrated), a metal electrode, a λ/4 phase-difference plate and a linear polarization plate are sequentially arranged in this order on the organic light-emitting layer, and a λ/2 phase-difference plate and a brightness enhancement film are arranged between the λ/4 phase-difference plate and the linear polarization plate.

Furthermore, the λ/2 phase-difference plate is arranged between the brightness enhancement film and the linear polarization plate, and there is a 45° angle between the direction of an absorption axis of the linear polarization plate and a slow axis of the λ/2 phase-difference plate, the direction of the absorption axis of the linear polarization plate is perpendicular to the direction of a polarization axis of the brightness enhancement film, and there is a 45° angle between the direction of the absorption axis of the linear polarization plate and a slow axis of the λ/4 phase-difference plate; and there is a 45° angle between the slow axis of the λ/2 phase-difference plate and the direction of the polarization axis of the brightness enhancement film, the slow axis of the λ/2 phase-difference plate is parallel to the slow axis of the λ/4 phase-difference plate, and there is a 45° angle between the direction of the polarization axis of the brightness enhancement film and the slow axis of the λ/4 phase-difference plate.

In the embodiment of the invention, light emitted from the OLED organic light-emitting layer is decomposed into P light parallel to the absorption axis of the linear polarization plate and S light perpendicular to the absorption axis of the linear polarization plate.

A path of S light in the optical member according to the embodiment of the invention passing the optical member will be described with reference to FIG. 8 taking as an example S light, emitted from the OLED organic light-emitting layer, perpendicular to the absorption axis of the linear polarization plate. Since the S light is perpendicular to the λ/4 phase-difference plate, the S light is turned into left-rotated circularly polarized light after passing the λ/4 phase-difference plate; since there is the 45° angle between the direction of the polarization axis of the brightness enhancement film and the slow axis of the λ/4 phase-difference plate, S light among the left-rotated circularly polarized light is parallel to the direction of the polarization axis of the brightness enhancement film and P light among the left-rotated circularly polarized light is perpendicular to the direction of the polarization axis of the brightness enhancement film, thus the S light among the left-rotated circularly polarized light can pass the brightness enhancement film; and the S light passing the brightness enhancement film is turned into P light after passing the λ/2 phase-difference plate due to the 45° angle between the slow axis of the λ/2 phase-difference plate and the direction of the polarization axis of the brightness enhancement film, and the P light can pass smoothly the linear polarization plate to the outside due to the 45° angle between the direction of the absorption axis of the linear polarization plate and the slow axis of the λ/2 phase-difference plate. In the embodiment of the invention, the P light passing the linear polarization plate for the first time to the outside will be defined as primary P light.

Furthermore since the P light among the left-rotated circularly polarized light is perpendicular to the direction of the polarization axis of the brightness enhancement film, the P light is reflected by the brightness enhancement film, the reflected P light propagates along a reversed route to the original route, the P light propagating in the reversed route passes the λ/4 phase-difference plate, and the P light is turned into right-rotated circularly polarized light after passing the λ/4 phase-difference plate due to the 45° angle between the direction of the polarization axis of the brightness enhancement film and the slow axis of the λ/4 phase-difference plate; and The right-rotated circularly polarized light passing the surface of the metal electrode is reflected by the metal electrode into left-rotated circularly polarized light; the left-rotated circularly polarized light is turned into S light after passing the λ/4 phase-difference plate; the S light can pass the brightness enhancement film due to the 45° angle between the slow axis of the λ/4 phase-difference plate and the direction of the polarization axis of the brightness enhancement film; the S light is turned into P light after passing the λ/2 phase-difference plate due to the 45° angle between the slow axis of the λ/2 phase-difference plate and the direction of the polarization axis of the brightness enhancement film, and the P light can pass smoothly the linear polarization plate due to the 45° angle between the direction of the absorption axis of the linear polarization plate and the slow axis of the λ/2 phase-difference plate. In the embodiment of the invention, the P light passing the linear polarization plate for the second time to the outside will be defined as secondary P light.

Figure 9:
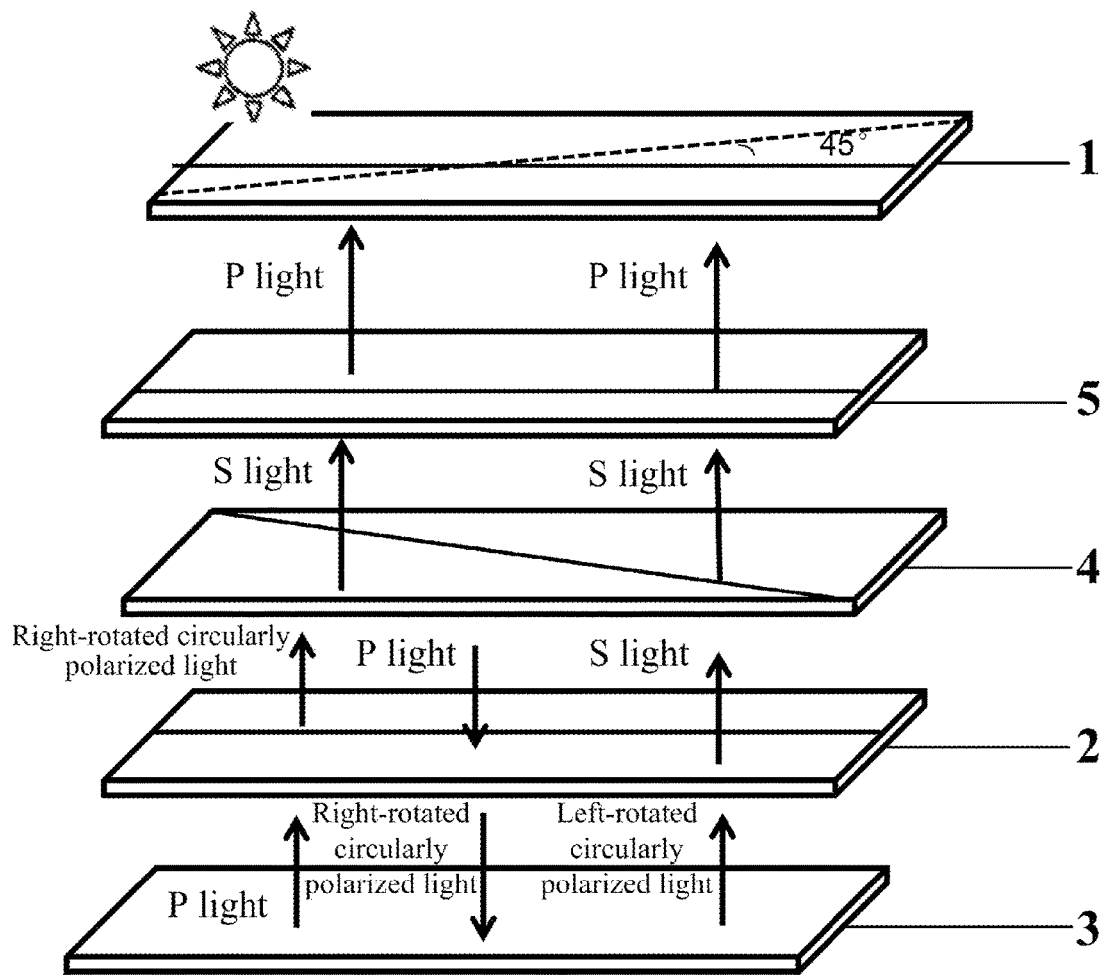
FIG. 9 illustrates a schematic diagram of a varying polarization state of P light in the optical member, parallel to the absorption axis of the linear polarization plate, emitted from the OLED organic light-emitting layer, according to the another embodiment of the invention.

A path of P light in the optical member according to the embodiment of the invention passing the optical member will be described with reference to FIG. 9 taking as an example P light, emitted from the OLED organic light-emitting layer, parallel to the absorption axis of the linear polarization plate. Since the P light is parallel to the λ/4 phase-difference plate, the P light is turned into right-rotated circularly polarized light after passing the λ/4 phase-difference plate; since there is the 45° angle between the slow axis of the λ/4 phase-difference plate and the direction of the polarization axis of the brightness enhancement film, S light among the right-rotated circularly polarized light is parallel to the direction of the polarization axis of the brightness enhancement film and P light among the right-rotated circularly polarized light is perpendicular to the direction of the polarization axis of the brightness enhancement film, thus the S light among the right-rotated circularly polarized light can pass the brightness enhancement film; and the S light is turned into P light after passing the λ/2 phase-difference plate due to the 45° angle between the direction of the polarization axis of the brightness enhancement film and the slow axis of the λ/2 phase-difference plate, and the P light can pass smoothly the linear polarization plate to the outside due to the 45° angle between the slow axis of the λ/2 phase-difference plate and the direction of the absorption axis of the linear polarization plate. In the embodiment of the invention, the P light passing the linear polarization plate for the first time to the outside will be defined as primary P light.

Furthermore since the P light among the right-rotated circularly polarized light is perpendicular to the direction of the polarization axis of the brightness enhancement film, the P light is reflected by the brightness enhancement film, the reflected P light propagates along a reversed route to the original route, the P light propagating in the reversed route passes the λ/4 phase-difference plate, and the P light is turned into right-rotated circularly polarized light after passing the λ/4 phase-difference plate due to the 45° angle between the slow axis of the λ/4 phase-difference plate and the direction of the polarization axis of the brightness enhancement film; the right-rotated circularly polarized light passing the surface of the metal electrode is reflected by the metal electrode into left-rotated circularly polarized light; the left-rotated circularly polarized light is turned into S light after passing the λ/4 phase-difference plate; the S light can pass the brightness enhancement film due to the 45° angle between the slow axis of the λ/4 phase-difference plate and the direction of the polarization axis of the brightness enhancement film; the S light is turned into P light after passing the λ/2 phase-difference plate due to the 45° angle between the direction of the polarization axis of the brightness enhancement film and the slow axis of the λ/2 phase-difference plate; and the P light can pass smoothly the linear polarization plate to the outside due to the 45° angle between the slow axis of the λ/2 phase-difference plate and the direction of the absorption axis of the linear polarization plate. In the embodiment of the invention, the P light passing the linear polarization plate for the second time to the outside will be defined as secondary P light.

In the embodiment of the invention, optical transmittivities and reflectivities in the embodiment of the invention will be described taking as an example that the λ/2 phase-difference plate has an optical transmittivity of 95%, the λ/4 phase-difference plate has an optical transmittivity of 98%, the metal electrode has a reflectivity of 40%, the linear polarization plate has a transmittivity of 98%, and the brightness enhancement film has an optical transmittivity of 48% and a reflectivity of 48%. However in a real application, optical absorptivities of the λ/2 phase-difference plate, the λ/4 phase-difference plate, the brightness enhancement film and the linear polarization plate will not be particularly limited; and furthermore the reflectivity and the transmittivity of the brightness enhancement film will not be limited either on the condition that the sum of the optical absorptivity, reflectivity and transmittivity of the brightness enhancement film are 1; and the reflectivity of the metal electrode will not be limited.

The output amount of light from the optical member according to this embodiment will be described.

Firstly the output amount of light from the optical member will be described taking as an example S light, emitted from the OLED organic light-emitting layer, perpendicular to the absorption axis of the linear polarization plate; and for the sake of a clear description, the S light perpendicular to the absorption axis of the linear polarization plate will be defined as original S light.

Since the S light is perpendicular to the λ/4 phase-difference plate with the 98% transmittivity, the S light is turned into left-rotated circularly polarized light, the output amount of which is 98% of the original S light, after passing the λ/4 phase-difference plate; since there is 45° angle between the slow axis of the λ/4 phase-difference plate and the direction of the direction of the polarization axis of the brightness enhancement film, S light among the left-rotated circularly polarized light is parallel to the direction of the polarization axis of the brightness enhancement film and P light among the left-rotated circularly polarized light is perpendicular to the direction of the polarization axis of the brightness enhancement film, thus the S light among the left-rotated circularly polarized light can pass the brightness enhancement film, and since the transmittivity of the brightness enhancement film is 48%, the output amount of the S light passing the brightness enhancement film is 98%*48% of the original S light; the S light is turned into P light, the output amount of which is 98%*48%*95% of the original S light, after passing the λ/2 phase-difference plate due to the 45° angle between the direction of the polarization axis of the brightness enhancement film and the slow axis of the λ/2 phase-difference plate with the 95% transmittivity; and the P light can pass smoothly the linear polarization plate to the outside due to the 45° angle between the slow axis of the λ/2 phase-difference plate and the absorption axis of the linear polarization plate, and since the transmittivity of the linear polarization plate is 98%, the output amount of the P light to the outside through the linear polarization plate is 98%*48%*95%*98% of the original S light. In this embodiment, the P light passing through the linear polarization plate for the first time will be defined as primary P light, the output amount of which is 98%*48%*95%*98%=43.8% of the original S light.

Furthermore since the P light among the left-rotated circularly polarized light is parallel to the direction of the polarization axis of the brightness enhancement film, the P light is reflected by the brightness enhancement film, the reflected P light propagates along a reversed route to the original propagation route, and since the reflectivity of the brightness enhancement film is 48%, the output amount of the reflected P light is 98%*48% of the original S light; the P light passes the λ/4 phase-difference plate, and the P light is turned into right-rotated circularly polarized light, the output amount of which is 98%*48%*98% of the original S light, after passing the λ/4 phase-difference plate due to the 45° angle between the slow axis of the λ/4 phase-difference plate and the direction of the polarization axis of the brightness enhancement film and the 98% transmittivity of the λ/4 phase-difference plate; the right-rotated circularly polarized light passing the surface of the metal electrode is reflected by the metal electrode into left-rotated circularly polarized light, and since the transmittivity of the metal electrode is 40%, the output amount of the left-rotated circularly polarized light is 98%*48%*98%*40% of the original S light; the left-rotated circularly polarized light is turned into S light after passing the λ/4 phase-difference plate, and since the transmittivity of the λ/4 phase-difference plate is 98%, the output amount of the S light is 98%*48%*98%*40%*98% of the original S light; the S light can pass the brightness enhancement film due to the 45° angle between the slow axis of the λ/4 phase-difference plate and the direction of the polarization axis of the brightness enhancement film, and since the transmittivity of the brightness enhancement film is 98%, the output amount of the S light is 98%*48%*98%*40%*98%*98% of the original S light; the S light is turned into P light after passing the λ/2 phase-difference plate due to the 45° angle between the direction of the polarization axis of the brightness enhancement film and the slow axis of the λ/2 phase-difference plate, and since the transmittivity of the λ/2 phase-difference plate is 95%, the output amount of the P light is 98%*48%*98%*40%*98%*98%*95% of the original S light; the P light can pass smoothly the linear polarization plate to the outside due to the 45° angle between the slow axis of the λ/2 phase-difference plate and the direction of the absorption axis of the linear polarization plate, and since the transmittivity of the linear polarization plate is 98%, the output amount of the P light passing the linear polarization plate to the outside is 98%*48%*98%*40%*98%*98%*95%*98% of the original S light. In the embodiment of the invention, the P light passing the linear polarization plate for the second time will be defined as secondary P light, the output amount of which is 98%*48%*98%*40%*98%*98%*95%*98%=16.5% of the original S light.

Secondly the output amount of light from the optical member will be described taking as an example P light, emitted from the OLED organic light-emitting layer, parallel to the absorption axis of the linear polarization plate; and for the sake of a clear description, the P light parallel to the absorption axis of the linear polarization plate will be defined as original P light.

Since the P light is parallel to the λ/4 phase-difference plate with the 98% transmittivity, the P light is turned into right-rotated circularly polarized light, the output amount of which is 98% of the original P light, after passing the λ/4 phase-difference plate; since there is the 45° angle between the slow axis of the λ/4 phase-difference plate and the direction of the direction of the polarization axis of the brightness enhancement film, S light among the right-rotated circularly polarized light is parallel to the direction of the polarization axis of the brightness enhancement film and P light among the right-rotated circularly polarized light is perpendicular to the direction of the polarization axis of the brightness enhancement film, thus the S light among the right-rotated circularly polarized light can pass the brightness enhancement film, and since the transmittivity of the brightness enhancement film is 48%, the output amount of the S light passing the brightness enhancement film is 98%*48% of the original P light; the S light is turned into P light, the output amount of which is 98%*48%*95% of the original P light, after passing the λ/2 phase-difference plate due to the 45° angle between the direction of the polarization axis of the brightness enhancement film and the slow axis of the λ/2 phase-difference plate with the 95% transmittivity; and the P light can pass smoothly the linear polarization plate to the outside due to the 45° angle between the slow axis of the λ/2 phase-difference plate and the absorption axis of the linear polarization plate, and since the transmittivity of the linear polarization plate is 98%, the output amount of the P light to the outside through the linear polarization plate is 98%*48%*95%*98% of the original P light. In the embodiment of the invention, the P light transmitted through the linear polarization plate for the first time will be defined as primary P light, the output amount of which is 98%*48%*95%*98%=43.8% of the original P light.

Furthermore since the P light among the right-rotated circularly polarized light is perpendicular to the direction of the polarization axis of the brightness enhancement film, the P light is reflected by the brightness enhancement film, the reflected P light propagates along a reversed route to the original propagation route, and since the reflectivity of the brightness enhancement film is 48%, the output amount of the reflected P light is 98%*48% of the original P light; the P light passes the λ/4 phase-difference plate, and the P light is turned into right-rotated circularly polarized light, the output amount of which is 98%*48%*98% of the original P light, after passing the λ/4 phase-difference plate due to the 45° angle between the slow axis of the λ/4 phase-difference plate and the direction of the polarization axis of the brightness enhancement film and with the 98% transmittivity of the λ/4 phase-difference plate; the right-rotated circularly polarized light passing the surface of the metal electrode is reflected by the metal electrode into left-rotated circularly polarized light, and since the reflectivity of the metal electrode is 40%, the output amount of the left-rotated circularly polarized light is 98%*48%*98%*40% of the original P light; the left-rotated circularly polarized light is turned into S light after passing the λ/4 phase-difference plate, and since the transmittivity of the λ/4 phase-difference plate is 98%, the output amount of the S light is 98%*48%*98%*40%*98% of the original P light; the S light can pass the brightness enhancement film due to the 45° angle between the slow axis of the λ/4 phase-difference plate and the direction of the polarization axis of the brightness enhancement film, and since the transmittivity of the brightness enhancement film is 98%, the output amount of the S light is 98%*48%*98%*40%*98%*98% of the original P light; the S light is turned into P light after passing the λ/2 phase-difference plate due to the 45° angle between the direction of the polarization axis of the brightness enhancement film and the slow axis of the λ/2 phase-difference plate, and since the transmittivity of the λ/2 phase-difference plate is 95%, the output amount of the P light is 98%*48%*98%*40%*98%*98%*95% of the original P light; the P light can pass smoothly the linear polarization plate to the outside due to the 45° angle between the slow axis of the λ/2 phase-difference plate and the direction of the absorption axis of the linear polarization plate, and since the transmittivity of the linear polarization plate is 98%, the output amount of the P light passing the linear polarization plate to the outside is 98%*48%*98%*40%*98%*98%*95%*98% of the original P light. In the embodiment of the invention, the P light passing the linear polarization plate for the second time will be defined as secondary P light, the output amount of which is 98%*48%*98%*40%*98%*98%*95%*98%=16.5% of the original P light.

It can be determined from the analysis above that with the brightness enhancement film added to the optical member, the light emitted from the optical member is decomposed into P light and S light, and the output amount of either the P light or the S light after passing the optical member according to this embodiment is the sum of the output amount of the primary P light and the output amount of the secondary P light, i.e., 43.8%+16.5%=60.3%.

The light emitted from the optical member is decomposed into P light and S light, and the total output amount of the P light or the S light after passing the optical member according to this embodiment reaches 60.3%; and the amount of light from the optical member according to the embodiment of the invention to which the brightness enhancement film is not added is 45.6%. The amount of light from the optical member according to the embodiment of the invention can be determined larger than the amount of light from the optical member to which the brightness enhancement film is not added by 32%.

Figure 10:
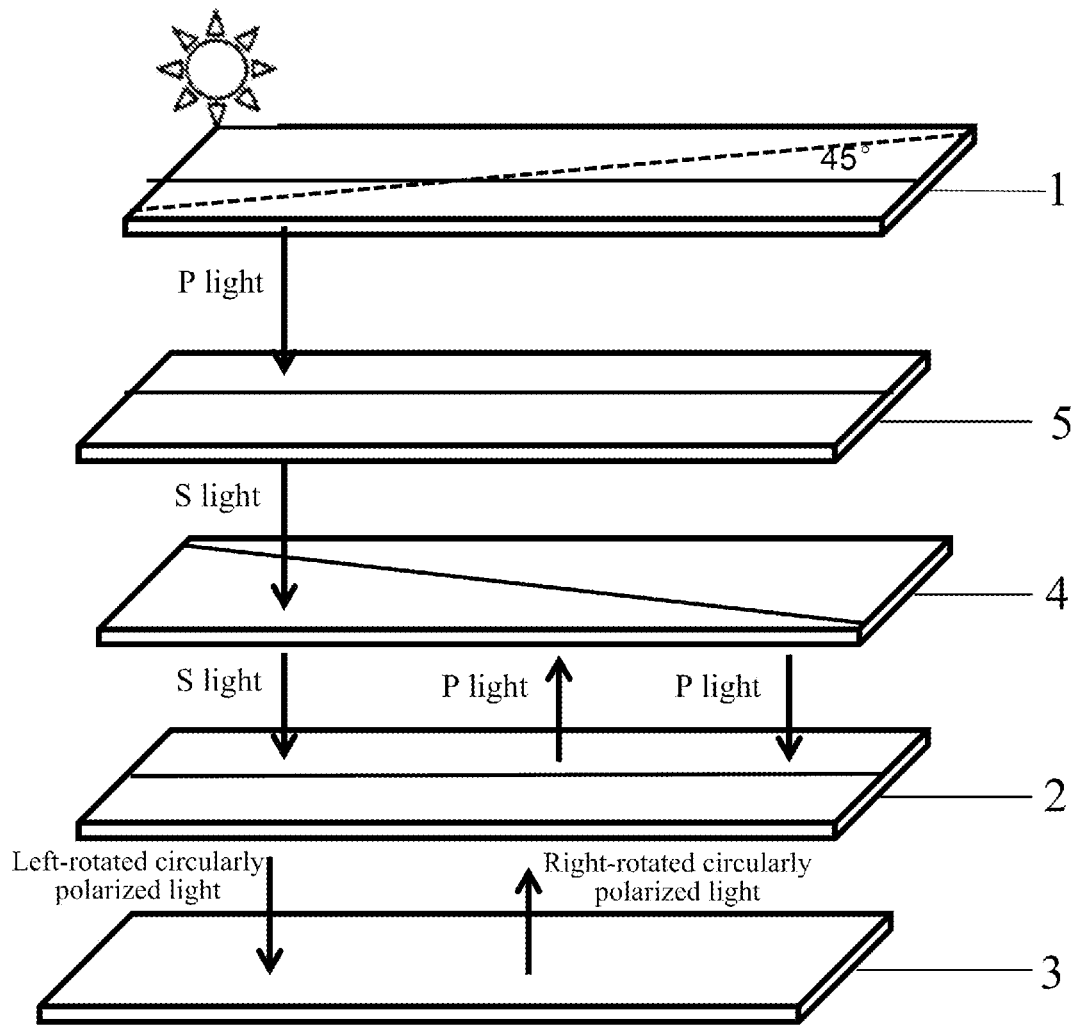
FIG. 10 illustrates a schematic diagram of a varying polarization state of outside natural light in the optical member according to the another embodiment of the invention.

A path of outside natural light being reflected will be described below with reference to FIG. 10.

After natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate; the P light passing the linear polarization plate is turned into S light after passing the λ/2 phase-difference plate due to the 45° angle between the absorption axis of the linear polarization plate and the slow axis of the λ/2 phase-difference plate; the S light passing the brightness enhancement film is still S light due to the 45° angle between the slow axis of the λ/2 phase-difference plate and the direction of the polarization axis of the brightness enhancement film; the S light is turned into left-rotated circularly polarized light after passing the λ/4 phase-difference plate due to the 45° angle between the direction of the polarization axis of the brightness enhancement film and the slow axis of the λ/4 phase-difference plate; the left-rotated circularly polarized light is reflected by the metal electrode into right-rotated circularly polarized light after passing the metal electrode layer; Since P light among the right-rotated circularly polarized light is parallel to the slow axis of the λ/4 phase-difference plate, and S light among the right-rotated circularly polarized light is perpendicular to the slow axis of the λ/4 phase-difference plate, the P light among the right-rotated circularly polarized light passes the λ/4 phase-difference plate; since there is the 45° angle between the direction of the polarization axis of the brightness enhancement film and the slow axis of the λ/4 phase-difference plate, and the P light is perpendicular to the direction of the polarization axis of the brightness enhancement film, the P light is reflected by the brightness enhancement film, the reflected P light propagates along a reversed route to the original propagation route, the P light propagating in the reversed route passes the λ/4 phase-difference plate, the P light passing the λ/4 phase-difference plate is turned into right-rotated circularly polarized light due to the 45° angle between the direction of the polarization axis of the brightness enhancement film and the slow axis of the λ/4 phase-difference plate, and the right-rotated circularly polarized light is reflected by the metal electrode into left-rotated circularly polarized light after passing the metal electrode layer; since S light among the left-rotated circularly polarized light is parallel to the slow axis of the λ/4 phase-difference plate, and P light among the left-rotated circularly polarized light is perpendicular to the slow axis of the λ/4 phase-difference plate, the S light among the left-rotated circularly polarized light passes the λ/4 phase-difference plate; the S light after passing the brightness enhancement film is still S light due to the 45° angle between the direction of the polarization axis of the brightness enhancement film and the slow axis of the λ/4 phase-difference plate; and the S light is turned into P light after passing the λ/2 phase-difference plate due to the 45° angle between the slow axis of the λ/2 phase-difference plate and the direction of the polarization axis of the brightness enhancement film, and the P light can pass smoothly through the linear polarization plate to the outside due to the 45° angle between the absorption axis of the linear polarization plate and the slow axis of the λ/2 phase-difference plate.

The reflectivity at which outside natural light is reflected will be described below with reference to FIG. 10.

In the embodiment of the invention, after natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate, and since the transmittivity of the linear polarization plate is 48%, the output amount of the P light passing the linear polarization plate is 48% of the natural light; the P light passing the linear polarization plate is turned into S light after passing the λ/2 phase-difference plate due to the 45° angle between the absorption axis of the linear polarization plate and the slow axis of the λ/2 phase-difference plate, and since the transmittivity of the λ/2 phase-difference plate is 95%, the output amount of the S light is 48%*95% of the natural light; the S light after passing the brightness enhancement film is still S light due to the 45° angle between the slow axis of the λ/2 phase-difference plate and the direction of the polarization axis of the brightness enhancement film, and since the transmittivity of the brightness enhancement film is 96%, the output amount of the S light is 48%*95%*96% of the natural light; the S light is turned into left-rotated circularly polarized light after passing the λ/4 phase-difference plate due to the 45° angle between the direction of the polarization axis of the brightness enhancement film and the slow axis of the λ/4 phase-difference plate, and since the transmittivity of the λ/4 phase-difference plate is 98%, the output amount of the left-rotated circularly polarized light is 48%*95%*96%*98% of the natural light; the left-rotated circularly polarized light is reflected by the metal electrode into right-rotated circularly polarized light after passing the metal electrode layer, and since the reflectivity of the metal electrode is 40%, the output amount of the right-rotated circularly polarized light is 48%*95%*96%*98%*40% of the natural light; the reflected right-rotated circularly polarized light is turned into P light after passing the λ/4 phase-difference plate, and since the transmittivity of the λ/4 phase-difference plate is 98%, the output amount of light after passing this layer is 48%*95%*96%*98%*40%*98% of the natural light; then the P light reaches the brightness enhancement film, and since the polarization direction of the P light is perpendicular to the polarization axis of the brightness enhancement film, the P light will be reflected back in a reversed direction to the original direction, and also since the transmittivity of the brightness enhancement film is 96%, the output amount of light is 48%*95%*96%*98%*40%*98%*96% of the natural light; the P light is turned into right-rotated circularly polarized light after passing the λ/4 phase-difference plate, and since the transmittivity of the λ/4 phase-difference plate is 98%, the output amount of the right-rotated circularly polarized light is 48%*95%*96%*98%*40%*98%*96%*98% of the natural light; then the right-rotated circularly polarized light passing the metal electrode is turned into left-rotated circularly polarized light, and since the reflectivity of the metal electrode is 40%, the output amount of the left-rotated circularly polarized light is 48%*95%*96%*98%*40%*98%*96%*98%*40% of the natural light; the left-rotated circularly polarized light is turned into S light after passing the λ/4 phase-difference plate, the S light can pass the brightness enhancement film, and since the transmittivity of the λ/4 phase-difference plate is 98%, and the transmittivity of the brightness enhancement film is 96%, the output amount of the S light passing the brightness enhancement film is 48%*95% *96%*98%*40%*98%*96%*98%*40%*98%*96% of the natural light; the S light is turned into P light after passing the λ/2 phase-difference plate due to the 45° angle between the slow axis of the λ/2 phase-difference plate and the direction of the polarization axis of the brightness enhancement film, and since the transmittivity of the λ/2 phase-difference plate is 95%, the output amount of the P light is 48%*95%*96%*98%*40%*98%*96%*98%*40%*98% *96%*95% of the natural light; and since the polarization direction of the P light is parallel to the direction of the absorption axis of the linear polarization plate, the P light can escape to the outside, and since the transmittivity of the linear polarization plate is 98%, the output amount of the P light escaping to the outside is 48%*95% *96%*98%*40%*98%*96%*98%*40%*98%*96%*95% *98%=5.4% of the natural light.

It can be determined from the analysis above that with the brightness enhancement film added to the optical member in this embodiment, the output amount (reflectivity) of the outside natural light can reach approximately 5.4%, whereas in the related art, with the brightness enhancement film not added to the optical member, the output amount (reflectivity) of the outside natural light is approximately 4%, so the output amount of light in the embodiment of the invention is larger than the output amount of light in the related art by a factor of approximately 35%.

In this embodiment, the brightness enhancement film is added to the optical member, but as compared with the first embodiment of the invention, the added brightness enhancement film and λ/2 phase-difference plate are swapped in location between the linear polarization plate and the λ/4 phase-difference plate, and there is a 90° angle between the absorption axis of the linear polarization plate and the polarization axis of the brightness enhancement film, so in this embodiment, the total output amount of light from the optical member to which the brightness enhancement film is added can reach 60.3%, and the output amount (reflectivity) of the outside natural light can reach at most 5.4%; and with the brightness enhancement film not added to the optical member, the total output amount of either the P light or the S light, into which light emitted from the optical member is decomposed, after passing the optical member to which the brightness enhancement film is not added can reach 45.6%, and the output amount (reflectivity) of the outside natural light can reach approximately 4%, so the output amount of light from the optical component according to this embodiment can be larger than in the related art by a factor of 32%.

Figure 11:
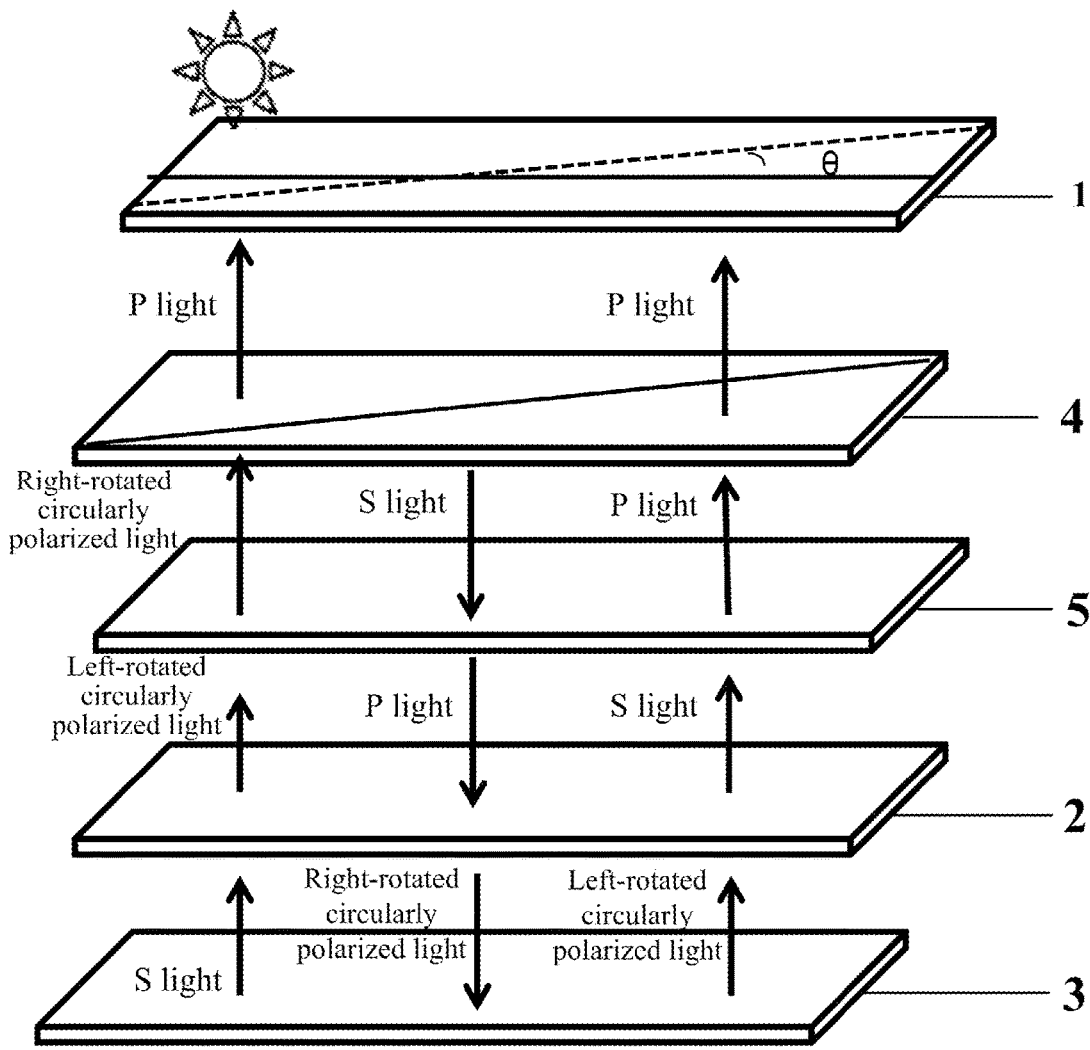
FIG. 11 illustrates a schematic diagram of a varying polarization state of S light in the optical member, perpendicular to then absorption axis of the linear polarization plate, emitted from the OLED organic light-emitting layer, according to still another embodiment of the invention.

Still another embodiment of the invention provides an optical member as illustrated in FIG. 11 including an OLED organic light-emitting layer (not illustrated), a metal electrode, a λ/4 phase-difference plate and a linear polarization plate are arranged in that order on the organic light-emitting layer, and a λ/2 phase-difference plate and a brightness enhancement film are arranged between the λ/4 phase-difference plate and the linear polarization plate.

Furthermore, the λ/2 phase-difference plate is arranged between the λ/4 phase-difference plate and the brightness enhancement film, and the direction of an absorption axis of the linear polarization plate is parallel to the direction of a polarization axis of the brightness enhancement film, there is an θ angle between the direction of the absorption axis of the linear polarization plate and a slow axis of the λ/2 phase-difference plate, and there is a θ angle between the direction of the absorption axis of the linear polarization plate and a slow axis of the λ/4 phase-difference plate; and there is a θ angle between the direction of the polarization axis of the brightness enhancement film and the slow axis of the λ/2 phase-difference plate, and there is a θ angle between the direction of the polarization axis of the brightness enhancement film and the slow axis of the λ/4 phase-difference plate, and the slow axis of the λ/2 phase-difference plate is parallel to the slow axis of the λ/4 phase-difference plate.

A path of light in the optical member passing the optical member will be described with reference to FIG. 11 taking as an example S light, emitted from the OLED organic light-emitting layer, perpendicular to the absorption axis of the linear polarization plate.

In the embodiment of the invention, light emitted from the OLED organic light-emitting layer is decomposed into P light parallel to the absorption axis of the linear polarization plate and S light perpendicular to the absorption axis of the linear polarization plate.

Since the S light is perpendicular to the λ/4 phase-difference plate, the S light is turned into left-rotated circularly polarized light after passing the λ/4 phase-difference plate; since the slow axis of the λ/4 phase-difference plate is parallel to the slow axis of the λ/2 phase-difference plate, the left-rotated circularly polarized light is turned into right-rotated circularly polarized light after passing the λ/2 phase-difference plate; since there is the θ angle between the direction of the polarization axis of the brightness enhancement film and the slow axis of the λ/2 phase-difference plate, P light among the right-rotated circularly polarized light is parallel to the direction of the polarization axis of the brightness enhancement film and S light among the right-rotated circularly polarized light is perpendicular to the direction of the polarization axis of the brightness enhancement film, thus the P light among the right-rotated circularly polarized light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the first time to the outside will be defined as primary P light.

Furthermore, since the S light among the right-rotated circularly polarized light is perpendicular to the direction of the polarization axis of the brightness enhancement film, the S light is reflected by the brightness enhancement film, the reflected S light propagates along a reversed route to the original route, the S light propagating in the reversed route passes the λ/2 phase-difference plate, and the S light is decomposed into first-level P light and first-level S light after passing the λ/2 phase-difference plate due to the θ angle between the slow axis of the λ/2 phase-difference plate and the direction of the polarization axis of the brightness enhancement film.

Firstly the first-level P light passing the optical member will be described.

Since the slow axis of the λ/2 phase-difference plate is parallel to the slow axis of the λ/4 phase-difference plate, the first-level P light is turned into right-rotated circularly polarized light after passing the λ/4 phase-difference plate; the right-rotated circularly polarized light passing the surface of the metal electrode is reflected by the metal electrode into left-rotated circularly polarized light; the left-rotated circularly polarized light is turned into S light after passing the λ/4 phase-difference plate; and the S light is decomposed into second-level P light and second-level S light after passing the λ/2 phase-difference plate due to the θ angle between the slow axis of the λ/2 phase-difference plate and the direction of the absorption axis of the linear polarization plate. In the embodiment of the invention, for the sake of a clear description, the second-level P light and the second-level S light into which the first-level P light is decomposed will be defined as second-level PP light and second-level PS light. Since the second-level PP light is parallel to the direction of the polarization axis of the brightness enhancement film, the second-level PP light can pass the brightness enhancement film; and since the direction of the absorption axis of the linear polarization axis is parallel to the direction of the polarization axis of the brightness enhancement film, the second-level PP light can pass smoothly the linear polarization axis to the outside. In the embodiment of the invention, the second-level PP light passing the linear polarization axis for the second time to the outside will be defined as secondary P light.

Secondly the first-level S light passing the optical member will be described.

Since the slow axis of the λ/2 phase-difference plate is parallel to the slow axis of the λ/4 phase-difference plate, the first-level S light is turned into left-rotated circularly polarized light after passing the λ/4 phase-difference plate; the left-rotated circularly polarized light passing the surface of the metal electrode is reflected by the metal electrode into right-rotated circularly polarized light; the right-rotated circularly polarized light is turned into P light after passing the λ/4 phase-difference plate; and the P light is decomposed into second-level P light and second-level S light after passing the λ/2 phase-difference plate due to the θ angle between the slow axis of the λ/2 phase-difference plate and the direction of the absorption axis of the linear polarization plate. In the embodiment of the invention, for the sake of a clear description, the second-level P light and the second-level S light into which the first-level S light is decomposed will be defined as second-level SP light and second-level SS light. Since the second-level SP light is parallel to the direction of the polarization axis of the brightness enhancement film, the second-level SP light can pass the brightness enhancement film; and since the direction of the absorption axis of the linear polarization axis is parallel to the direction of the polarization axis of the brightness enhancement film, the second-level SP light can pass smoothly the linear polarization axis to the outside. In the embodiment of the invention, the second-level SP light passing the linear polarization axis for the second time to the outside will be defined as secondary P light.

In the embodiment of the invention, since only a fraction of the second-level PS light into which the first-level P light is decomposed, and the second-level SS light into which the first-level S light is decomposed, after being reflected twice can transmit to the outside, the second-level PS light into which the first-level P light is decomposed and the second-level SS light into which the first-level S light is decomposed will not be taken into account in the embodiment of the invention.

Figure 12:
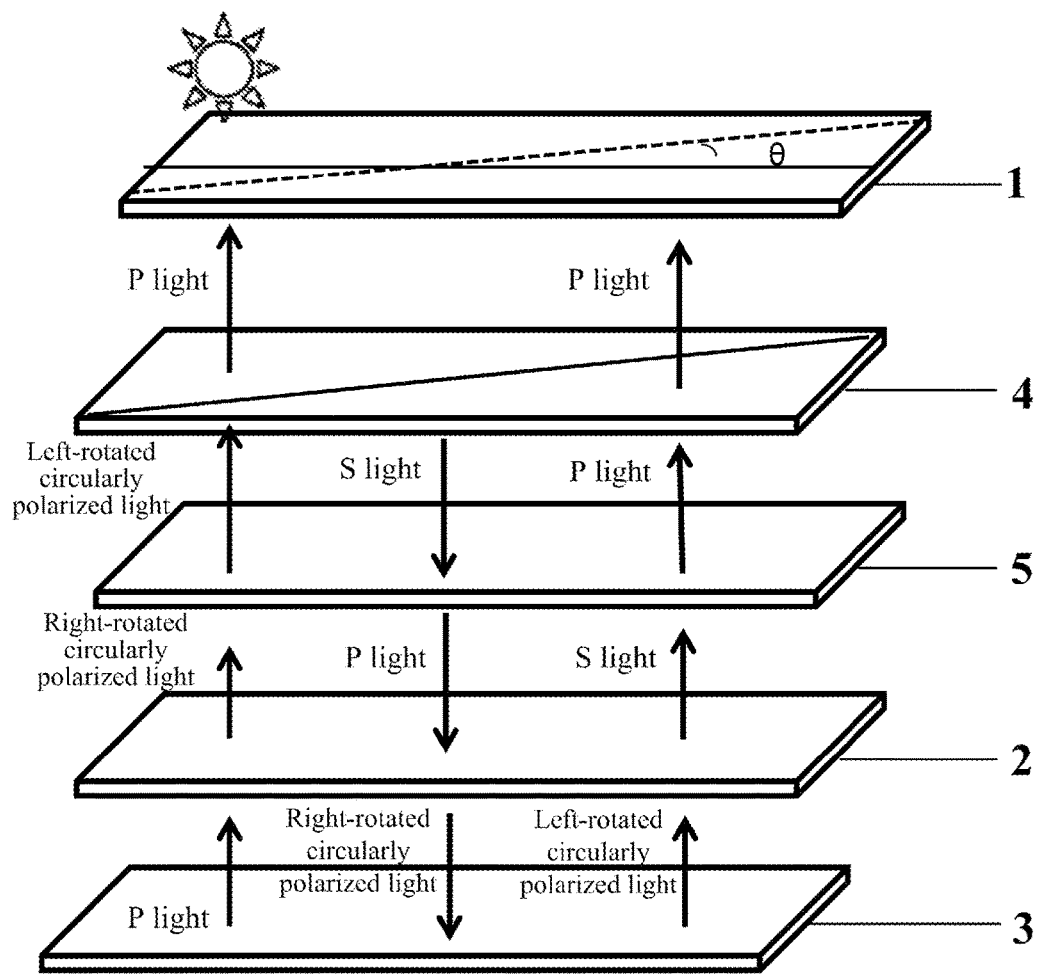
FIG. 12 illustrates a schematic diagram of a varying polarization state of P light in the optical member, parallel to the absorption axis of the linear polarization plate, emitted from the OLED organic light-emitting layer, according to the still another embodiment of the invention.

A path of light in the optical member passing the optical member will be described with reference to FIG. 12 taking as an example P light, emitted from the OLED organic light-emitting layer, parallel to the absorption axis of the linear polarization plate.

Since the P light is parallel to the λ/4 phase-difference plate, the P light is turned into right-rotated circularly polarized light after passing the λ/4 phase-difference plate; since the slow axis of the λ/4 phase-difference plate is parallel to the slow axis of the λ/2 phase-difference plate, the right-rotated circularly polarized light is turned into left-rotated circularly polarized light after passing the λ/2 phase-difference plate; since there is the θ angle between the direction of the polarization axis of the brightness enhancement film and the slow axis of the λ/2 phase-difference plate, P light among the left-rotated circularly polarized light is parallel to the direction of the polarization axis of the brightness enhancement film and S light among the left-rotated circularly polarized light is perpendicular to the direction of the polarization axis of the brightness enhancement film, thus the P light among the right-rotated circularly polarized light can pass the brightness enhancement film; and since the direction of the absorption axis of the linear polarization plate is parallel to the direction of the polarization axis of the brightness enhancement film, the P light can pass smoothly the linear polarization plate to the outside. In the embodiment of the invention, the P light passing the linear polarization plate for the first time to the outside will be defined as primary P light.

Furthermore since the S light among the right-rotated circularly polarized light is perpendicular to the direction of the polarization axis of the brightness enhancement film, the S light is reflected by the brightness enhancement film, the reflected S light propagates along a reversed route to the original route, the S light propagating in the reversed route passes the λ/2 phase-difference plate, and the S light is decomposed into first-level P light and first-level S light after passing the λ/2 phase-difference plate due to the θ angle between the slow axis of the λ/2 phase-difference plate and the direction of the absorption axis of the linear polarization plate.

Firstly the first-level P light passing the optical member will be described.

Since the slow axis of the λ/2 phase-difference plate is parallel to the slow axis of the λ/4 phase-difference plate, the first-level P light is turned into right-rotated circularly polarized light after passing the λ/4 phase-difference plate; the right-rotated circularly polarized light passing the surface of the metal electrode is reflected by the metal electrode into left-rotated circularly polarized light; the left-rotated circularly polarized light is turned into S light after passing the λ/4 phase-difference plate; and the S light is decomposed into second-level P light and second-level S light after passing the λ/2 phase-difference plate due to the θ angle between the slow axis of the λ/2 phase-difference plate and the direction of the absorption axis of the linear polarization plate. In the embodiment of the invention, for the sake of a clear description, the second-level P light and the second-level S light into which the first-level P light is decomposed will be defined as second-level PP light and second-level PS light. Since the second-level PP light is parallel to the direction of the polarization axis of the brightness enhancement film, the second-level PP light can pass the brightness enhancement film; and since the direction of the absorption axis of the linear polarization axis is parallel to the direction of the polarization axis of the brightness enhancement film, the second-level PP light can pass smoothly the linear polarization axis to the outside. In the embodiment of the invention, the second-level PP light passing the linear polarization axis for the second time to the outside will be defined as secondary P light.

Secondly the first-level S light passing the optical member will be described.

Since the slow axis of the λ/2 phase-difference plate is parallel to the slow axis of the λ/4 phase-difference plate, the first-level S light is turned into left-rotated circularly polarized light after passing the λ/4 phase-difference plate; the left-rotated circularly polarized light passing the surface of the metal electrode is reflected by the metal electrode into right-rotated circularly polarized light; the right-rotated circularly polarized light is turned into P light after passing the λ/4 phase-difference plate; and the P light is decomposed into second-level P light and second-level S light after passing the λ/2 phase-difference plate due to the θ angle between the slow axis of the λ/2 phase-difference plate and the direction of the absorption axis of the linear polarization plate. In the embodiment of the invention, for the sake of a clear description, the second-level P light and the second-level S light into which the first-level S light is decomposed will be defined as second-level SP light and second-level SS light. Since the second-level SP light is parallel to the direction of the polarization axis of the brightness enhancement film, the second-level SP light can pass the brightness enhancement film; and since the direction of the absorption axis of the linear polarization axis is parallel to the direction of the polarization axis of the brightness enhancement film, the second-level SP light can pass smoothly the linear polarization axis to the outside. In the embodiment of the invention, the second-level SP light passing the linear polarization axis for the second time to the outside will be defined as secondary P light.

In the embodiment of the invention, since only a fraction of the second-level PS light into which the first-level P light is decomposed and the second-level SS light into which the first-level S light is decomposed, after being reflected twice can transmit to the outside, the second-level PS light into which the first-level P light is decomposed and the second-level SS light into which the first-level S light is decomposed will not be taken into account in the embodiment of the invention.

In the embodiment of the invention, optical transmittivities and reflectivities in the embodiment of the invention will be described taking as an example that the $\lambda/2$ phase-difference plate has an optical transmittivity of 95%, the $\lambda/4$ phase-difference plate has an optical transmittivity of 98%, the metal electrode has a reflectivity of 40%, the linear polarization plate has a transmittivity of 98%, and the brightness enhancement film has an optical transmittivity of 48% and a reflectivity of 48%. However in a real application, optical absorptivities of the $\lambda/2$ phase-difference plate, the $\lambda/4$ phase-difference plate, the brightness enhancement film and the linear polarization plate will not be particularly limited; and furthermore the reflectivity and the transmittivity of the brightness enhancement film will not be limited either on the condition that the sum of the optical absorptivity, reflectivity and transmittivity of the brightness enhancement film are 1; and the reflectivity of the metal electrode will not be limited.

A path of light in the optical member passing the optical member will be described with reference to FIG. 11 taking as an example S light, emitted from the OLED organic light-emitting layer, perpendicular to the absorption axis of the linear polarization plate; and for the sake of a clear description, the S light perpendicular to the absorption axis of the linear polarization plate will be defined as original S light.

Since the original S light is perpendicular to the absorption axis of the linear polarization plate, the S light is turned into left-rotated circularly polarized light after passing the $\lambda/4$ phase-difference plate, and since the transmittivity of the $\lambda/4$ phase-difference plate is 98%, the output amount of the left-rotated circularly polarized light is 98% of the original S light; since the slow axis of the $\lambda/4$ phase-difference plate is parallel to the slow axis of the $\lambda/2$ phase-difference plate with the 95% transmittivity, the left-rotated circularly polarized light is turned into right-rotated circularly polarized light, the output amount of which is 98%*95% of the original S light, after passing the $\lambda/2$ phase-difference plate; since S light among the right-rotated circularly polarized light is perpendicular to the direction of the polarization axis of the brightness enhancement film and P light among the right-rotated circularly polarized light is parallel to the direction of the polarization axis of the brightness enhancement film, and the transmittivity of the brightness enhancement film is 48%, the output amount of the P light passing the brightness enhancement film is 98%*95%*48% of the original S light; and since the direction of the absorption axis of the linear polarization plate is parallel to the direction of the polarization axis of the brightness enhancement film, the P light passing the brightness enhancement film can pass smoothly the linear polarization plate, and since the transmittivity of the linear polarization plate is 98%, the output amount of the P light passing through the linear polarization plate to the outside is 98%*95%*48%*98% of the original S light. In the embodiment of the invention, the P light passing for the first time through the linear polarization plate will be defined as primary P light, the output amount of which is 98%*95%*48%*98%=43.8% of the original S light.

Furthermore since the S light among the right-rotated circularly polarized light is perpendicular to the direction of the polarization axis of the brightness enhancement film, the S light among the right-rotated circularly polarized light is reflected by the brightness enhancement film, the reflected S light propagates along a reversed route to the original propagation route, and since the reflectivity of the brightness enhancement film is 48%, the output amount of the reflected S light is 98%*95%*48% of the original S light; and the S light is turned into P light and S light after passing the $\lambda/2$ phase-difference plate due to the $\theta$ angle between the slow axis of the $\lambda/2$ phase-difference plate and the absorption axis of the linear polarization plate. In this embodiment, for the sake of a convenient description, the P light and the S light into which the light is turned after passing the $\lambda/2$ phase-difference plate will be defined as first-level P light and first-level S light, and for the first-level S light and the first-level P light into which the light is decomposed, the output amount of the first-level S light is 98%*95%*48%*95%*cos 2$\theta$ of the original S light, and the output amount of the first-level P light is 98%*95%*48%*95%*sin 2$\theta$ of the original S light.

Firstly the output amount of the first-level P light passing the optical member will be described.

Furthermore since the slow axis of the $\lambda/2$ phase-difference plate is parallel to the slow axis of the $\lambda/4$ phase-difference plate with the 98% transmittivity, the first-level P light is turned into right-rotated circularly polarized light, the output amount of which is 98%*95%*48%*95%*sin 2$\theta$*98% of the original S light, after passing the $\lambda/4$ phase-difference plate; the right-rotated circularly polarized light passing the surface of the metal electrode is reflected by the metal electrode into left-rotated circularly polarized light, and since the reflectivity of the metal electrode is 40%, the output amount of the left-rotated circularly polarized light is 98%*95%*48%*95%*sin 2$\theta$*98%*40% of the original S light; the left-rotated circularly polarized light is turned into S light after passing the $\lambda/4$ phase-difference plate, and since the transmittivity of the $\lambda/4$ phase-difference plate is 98%, the output amount of the S light is 98%*95%*48%*95%*sin 2$\theta$*98%*40%*98% of the original S light; and the S light passing the $\lambda/2$ phase-difference plate is decomposed into second-level P light and second-level S light due to the $\theta$ angle between the slow axis of the $\lambda/2$ phase-difference plate and the absorption axis of the linear polarization plate. In the embodiment of the invention, for the sake of a clear description, the second-level P light and the second-level S light into which the first-level P light is decomposed will be defined as second-level PP light and second-level PS light, so the output amount of the second-level PP light is 98%*95%*48%*95%*sin 2$\theta$*98%*40%*98%*95%*sin 2$\theta$ of the original S light.

Furthermore since the slow axis of the $\lambda/2$ phase-difference plate is parallel to the slow axis of the $\lambda/4$ phase-difference plate, the second-level PP light can pass the brightness enhancement film, and since the transmittivity of the brightness enhancement film is 96%, the output amount of the second-level PP light passing the brightness enhancement film is 98%*95%*48%*95%*sin 2$\theta$*98%*40%*98%*95%*sin 2$\theta$*96% of the original S light; and since the direction of the absorption axis of the linear polarization plate is parallel to the direction of the polarization direction of the brightness enhancement film, the second-level PP light can pass smoothly the linear polarization plate to the outside, and since the transmittivity of the linear polarization plate is 98%, the output amount of the passing second-level PP light is 98%*95%*48%*95%*sin 2$\theta$*98%*40%*98%*95%*sin 2$\theta$*96%*98% of the original S light. In the embodiment of the invention, the second-level PP light transmitted through the linear polarization plate among the first-level P light will be defined as second-level PP light, the output amount of which is $98\%*95\%*48\%*95\%*\sin 2\theta*98\%*40\%*98\%*95\%*\sin 2\theta*96\%*98\%=14.6\%*\sin 2\theta*\sin 2\theta$ of the original P light.

Secondly the output amount of the first-level S light passing the optical member will be described.

Since the slow axis of the λ/2 phase-difference plate is parallel to the slow axis of the λ/4 phase-difference plate with the 98% transmittivity, the first-level S light is turned into left-rotated circularly polarized light, the output amount of which is $98\%*95\%*48\%*95\%*\cos 2\theta*98\%$ of the original S light, after passing the λ/4 phase-difference plate; the left-rotated circularly polarized light passing the surface of the metal electrode is reflected by the metal electrode into right-rotated circularly polarized light, and since the reflectivity of the metal electrode is 40%, the output amount of the right-rotated circularly polarized light is $98\%*95\%*48\%*95\%*\cos 2\theta*98\%*40\%$ of the original S light; the right-rotated circularly polarized light is turned into P light after passing the λ/4 phase-difference plate, and since the transmittivity of the λ/4 phase-difference plate is 98%, the output amount of the P light is $98\%*95\%*48\%*95\%*\cos 2\theta*98\%*40\%*98\%$ of the original S light; and the P light passing the λ/2 phase-difference plate is decomposed into second-level S light and second-level P light due to the θ angle between the slow axis of the λ/2 phase-difference plate and the absorption axis of the linear polarization plate. In the embodiment of the invention, for the sake of a clear description, the second-level P light and the second-level S light into which the first S light is decomposed will be defined as second-level SP light and second-level SS light, so the output amount of the second-level SP light is $98\%*95\%*48\%*95\%*\cos 2\theta*98\%*40\%*98\%*95\%*\cos 2\theta$ of the original S light. Since the second-level SP light is parallel to the direction of the polarization axis of the brightness enhancement film with the 96% transmittivity, the output amount of the P light passing the brightness enhancement film is $98\%*95\%*48\%*95\%*\cos 2\theta*98\%*40\%*98\%*\cos 2\theta*95\%*96\%$ of the original S light; and since the direction of the absorption axis of the linear polarization plate is parallel to the direction of the polarization axis of the brightness enhancement film, the second-level SP light can pass smoothly the linear polarization plate to the outside, and since the transmittivity of the linear polarization plate is 98%, the output amount of the second-level SP light passing the linear polarization plate is $98\%*95\%*48\%*95\%*\cos 2\theta*98\%*40\%*98\%*\cos 2\theta*95\%*96\%*98\%$ of the original S light. In the embodiment of the invention, the second-level SP light transmitted through the linear polarization plate among the first-level S light will be defined as second-level SP light, the output amount of which is $98\%*95\%*48\%*95\%*\cos 2\theta*98\%*40\%*98\%*\cos 2\theta*95\%*96\%*98\%=14.6\%*\cos 2\theta*\cos 2\theta$ of the original P light.

Furthermore, since the second-level S light is reflected secondarily, and the output amount of the secondarily reflected S light is a fraction of the original P light, the output amount of the second-level S light will not be taken into account in the embodiment of the invention.

A path of light in the optical member passing the optical member will be described with reference to FIG. 12 taking as an example P light, emitted from the OLED organic light-emitting layer, parallel to the absorption axis of the linear polarization plate; and for the sake of a clear description, the P light, emitted from the OLED organic light-emitting layer, parallel to the absorption axis of the linear polarization plate will be defined as original P light.

Since the original P light is parallel to the absorption axis of the linear polarization plate, the P light is turned into right-rotated circularly polarized light after passing the λ/4 phase-difference plate, and since the transmittivity of the λ/4 phase-difference plate is 98%, the output amount of the transmitted right-rotated circularly polarized light is 98% of the original P light; since the slow axis of the λ/4 phase-difference plate is parallel to the slow axis of the λ/2 phase-difference plate with the 95% transmittivity, the right-rotated circularly polarized light is turned into left-rotated circularly polarized light, the output amount of which is $98\%*95\%$ of the original P light, after passing the λ/2 phase-difference plate; since S light among the left-rotated circularly polarized light is perpendicular to the direction of the polarization axis of the brightness enhancement film and P light among the left-rotated circularly polarized light is parallel to the direction of the polarization axis of the brightness enhancement film, and the transmittivity of the brightness enhancement film is 48%, the output amount of the P light passing the brightness enhancement film is $98\%*95\%*48\%$ of the original P light; and since the direction of the absorption axis of the linear polarization plate is parallel to the direction of the polarization axis of the brightness enhancement film, the P light passing the brightness enhancement film can pass smoothly the linear polarization plate, and since the transmittivity of the linear polarization plate is 98%, the output amount of the P light passing through the linear polarization plate to the outside is $98\%*95\%*48\%*98\%$ of the original P light. In the embodiment of the invention, the P light passing for the first time through the linear polarization plate will be defined as primary P light, the output amount of which is $98\%*95\%*48\%*98\%=43.8\%$ of the original P light.

Furthermore, since the S light among the left-rotated circularly polarized light is perpendicular to the direction of the polarization axis of the brightness enhancement film, the S light among the left-rotated circularly polarized light is reflected by the brightness enhancement film, the reflected S light propagates along a reversed route to the original propagation route, and since the reflectivity of the brightness enhancement film is 48%, the output amount of the reflected S light is $98\%*95\%*48\%$ of the original P light; and the S light is turned into P light and S light after passing the λ/2 phase-difference plate due to the θ angle between the slow axis of the λ/2 phase-difference plate and the absorption axis of the linear polarization plate. In this embodiment, for the sake of a convenient description, the P light and the S light into which the light is turned after passing the λ/2 phase-difference plate will be defined as first-level P light and first-level S light, and for the first-level S light and the first-level P light into which the light is decomposed, the output amount of the first-level S light is $98\%*95\%*48\%*95\%*\cos 2\theta$ of the original P light, and the output amount of the first-level P light is $98\%*95\%*48\%*95\%*\sin 2\theta$ of the original P light.

Firstly the output amount of the first-level P light passing the optical member will be described.

Furthermore, since the slow axis of the λ/2 phase-difference plate is parallel to the slow axis of the λ/4 phase-difference plate with the 98% transmittivity, the first-level P light is turned into right-rotated circularly polarized light, the output amount of which is $98\%*95\%*48\%*95\%*\sin 2\theta*98\%$ of the original P light, after passing the λ/4 phase-difference plate; the right-rotated circularly polarized light passing the surface of the metal electrode is reflected by the metal electrode into left-rotated circularly polarized light, and since the reflectivity of the metal electrode is 40%, the output amount of the left-rotated circularly polarized light is 98%*95%*48%*95%*sin 2θ*98%*40% of the original P light; the left-rotated circularly polarized light is turned into S light after passing the λ/4 phase-difference plate, and since the transmittivity of the λ/4 phase-difference plate is 98%, the output amount of the S light is 98%*95%*48%*95%*sin 2θ*98%*40%*98% of the original P light; and the S light passing the λ/2 phase-difference plate is decomposed into second-level P light and second-level S light due to the θ angle between the slow axis of the λ/2 phase-difference plate and the absorption axis of the linear polarization plate. In the embodiment of the invention, for the sake of a clear description, the second-level P light and the second-level S light into which the first-level P light is decomposed will be defined as second-level PP light and second-level PS light, so the output amount of the second-level PP light is 98%*95%*48%*95%*sin 2θ*98%*40%*98%*sin 2θ of the original P light.

Furthermore, since the slow axis of the λ2 phase-difference plate is parallel to the slow axis of the λ/4 phase-difference plate, the second-level PP light can pass the brightness enhancement film, and since the transmittivity of the brightness enhancement film is 96%, the output amount of the second-level PP light passing the brightness enhancement film is 98%*95%*48%*95%*sin 2θ*98%*40%*98%*95%*sin 2θ*96% of the original S light; and since the direction of the absorption axis of the linear polarization plate is parallel to the direction of the polarization direction of the brightness enhancement film, the second-level PP light can pass smoothly the linear polarization plate to the outside, and since the transmittivity of the linear polarization plate is 98%, the output amount of the passing second-level PP light is 98%*95%*48%*95%*sin 2θ*98%*40%*98%*95%*sin 2θ*96%*98% of the original S light. In the embodiment of the invention, the second-level PP light passing through the linear polarization plate among the first-level P light will be defined as secondary PP light, the output amount of which is 98%*95%*48%*95%*sin 2θ*98%*40%*98%*95%*sin 2θ*96%*98%=14.6%*sin 2θ*sin 2θ of the original P light.

Secondly the output amount of the first-level S light passing the optical member will be described.

Since the slow axis of the λ/2 phase-difference plate is parallel to the slow axis of the λ/4 phase-difference plate with the 98% transmittivity, the first-level S light is turned into left-rotated circularly polarized light, the output amount of which is 98%*95%*48%*95%*cos 2θ*98% of the original S light, after passing the λ/4 phase-difference plate; the left-rotated circularly polarized light passing the surface of the metal electrode is reflected by the metal electrode into right-rotated circularly polarized light, and since the reflectivity of the metal electrode is 40%, the output amount of the right-rotated circularly polarized light is 98%*95%*48%*95%*cos 2θ*98%*40% of the original S light; the right-rotated circularly polarized light is turned into P light after passing the λ/4 phase-difference plate, and since the transmittivity of the λ/4 phase-difference plate is 98%, the output amount of the P light is 98%*95%*48%*95%*cos 2θ*98%*40%*98% of the original S light; and the P light passing the λ/2 phase-difference plate is decomposed into second-level S light and second-level P light due to the θ angle between the slow axis of the λ/2 phase-difference plate and the absorption axis of the linear polarization plate. In the embodiment of the invention, for the sake of a clear description, the second-level P light and the second-level S light into which the first-level S light is decomposed will be defined as second-level SP light and second-level SS light, so the output amount of the second-level SP light is 98%*95%*48%*95%*cos 2θ*98%*40%*98%*95%*cos 2θ of the original S light. Since the second-level SP light is parallel to the direction of the polarization axis of the brightness enhancement film with the 96% transmittivity, the output amount of the P light passing the brightness enhancement film is 98%*95%*48%*95%*cos 2θ*98%*40%*98%*cos 2θ*95%*96% of the original S light; and since the direction of the absorption axis of the linear polarization plate is parallel to the direction of the polarization axis of the brightness enhancement film, the second-level SP light can pass smoothly the linear polarization plate to the outside, and since the transmittivity of the linear polarization plate is 98%, the output amount of the second-level SP light passing the linear polarization plate is 98%*95%*48%*95%*cos 2θ*98%*40%*98%*cos 2θ*95%*96%*98% of the original S light. In the embodiment of the invention, the second-level SP light transmitted through the linear polarization plate among the first-level S light will be defined as secondary SP light, the output amount of which is 98%*95%*48%*95%*cos 2θ*98%*40%*98%*cos 2θ*95%*96%*98%=14.6%*cos 2θ*cos 2θ of the original P light.

Furthermore, since the second-level S light is reflected secondarily, and the output amount of the secondarily reflected S light is a fraction of the original P light, the output amount of the second-level S light will not be taken into account in the embodiment of the invention. It can be determined from the analysis above that in this embodiment, the output amount of either the S light perpendicular to the absorption axis of the linear polarization plate, or the P light parallel to the absorption axis of the linear polarization plate, emitted from the OLED organic light-emitting layer, after passing the optical member according to this embodiment includes three components which are the output amount of the primary P light, the output amount of the secondary PP light, and the output amount of the secondary SP light, the total amount of which is 98%*95%*48%*98%+98%*95%*48%*95%*sin 2θ*98%*40%*98%*95%*sin 2θ*96%*98%+98%*95%*48%*95%*cos 2θ*98%*40%*98%*cos 2θ*95%*96%*98%=43.8%+14.6%*cos 2θ*cos 2θ+14.6%*sin 2θ*sin 2θ=58.3%.

It can be apparent from the derivation above that the resulting total output amount of light is 58.3%, and in this embodiment, the total output amount of the light, emitted from the OLED organic light-emitting layer, after passing the optical member is independent of the angle of the absorption angle of the linear polarization plate in the optical member.

Figure 13:
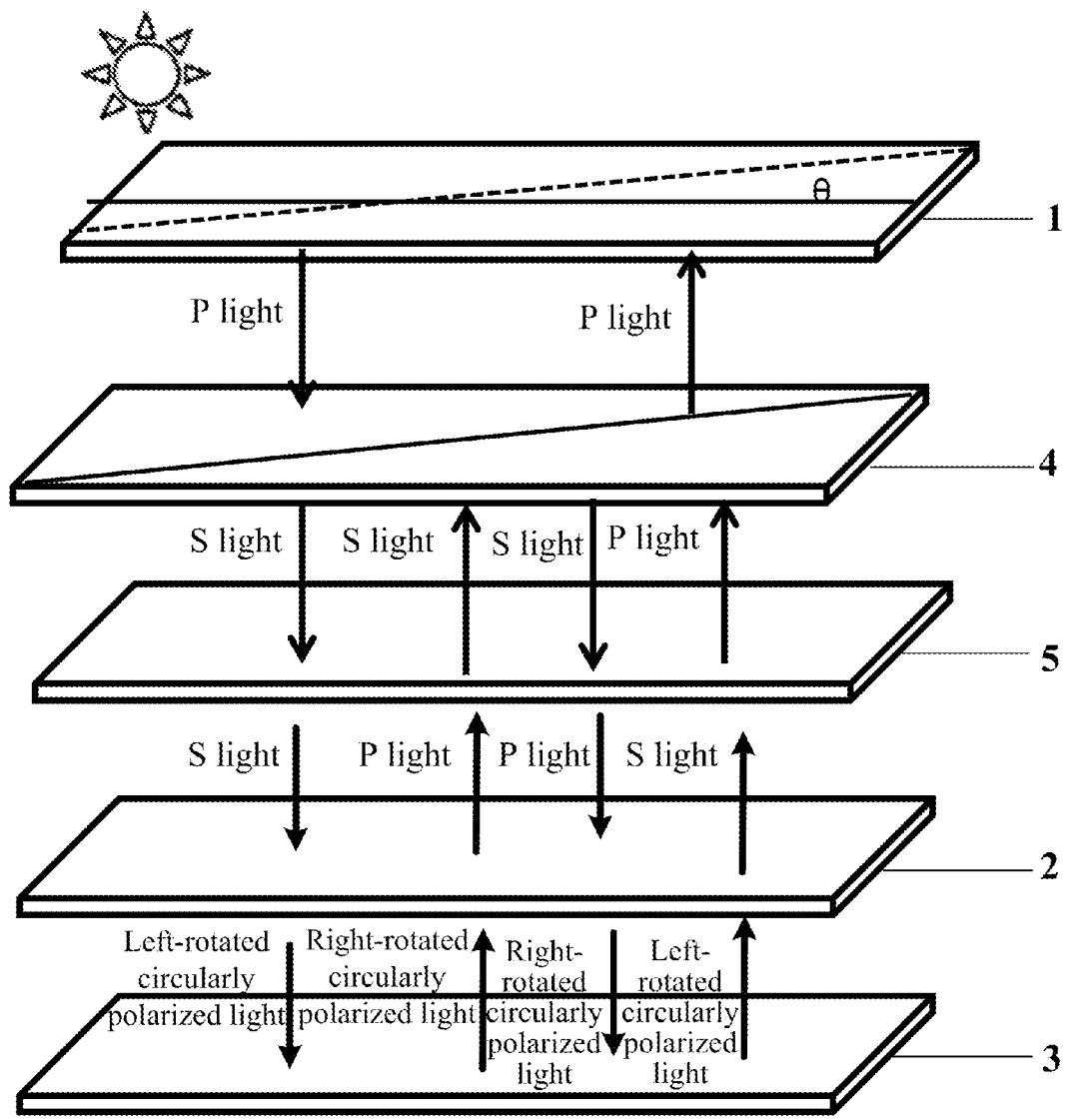
FIG. 13 illustrates a schematic diagram of a varying polarization state of outside natural light in the optical member according to the still another embodiment of the invention.

A path of outside natural light being reflected will be described below with reference to FIG. 13.

After natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate; and the P light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the light is turned after passing the λ/2 phase-difference plate will be defined as first-level P light and first-level S light.

For the sake of a clear description, firstly transmission of the first-level S light will be described below.

Furthermore, since the slow axis of the λ/2 phase-difference plate is parallel to the slow axis of the λ/4 phase-difference plate, the first-level S light is turned into left-rotated circularly polarized light after passing the λ/4 phase-difference plate; the left-rotated circularly polarized light is reflected by the metal electrode into right-rotated circularly polarized light after passing the metal electrode layer, the reflected right-rotated circularly polarized light propagates in a reversed route to the original propagation route, and the right-rotated circularly polarized light is turned into P light after passing the λ/4 phase-difference plate; and the P light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the first-level S light is decomposed will be defined as second-level SP light and second-level SS light.

Furthermore, the second-level SP light can escape to the outside through the brightness enhancement film and the linear polarization plate; the second-level SS light is reflected by the brightness enhancement film, the reflected S light propagates in a reversed route to the original propagation route, the S light propagating in the reversed route passes the λ/2 phase-difference plate, and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the second-level SS light is decomposed will be defined as third-level SSP light and third-level SSS light.

Furthermore, since the slow axis of the λ/2 phase-difference plate is parallel to the slow axis of the λ/4 phase-difference plate, the third-level SSP light is turned into right-rotated circularly polarized light after passing the λ/4 phase-difference plate; the right-rotated circularly polarized light is reflected by the metal electrode into left-rotated circularly polarized light after passing the metal electrode layer, the reflected left-rotated circularly polarized light propagates in a reversed route to the original propagation route, and the left-rotated circularly polarized light is turned into S light after passing the λ/4 phase-difference plate; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the third-level SSP light is decomposed will be defined as fourth-level SSPP light and fourth-level SSPS light.

Furthermore, the fourth-level SSPS light can escape to the outside through the brightness enhancement film and the linear polarization plate. Since the first-level S light is decomposed into the second-level SP light which escapes to the outside through the linear polarization plate, and the second-level SS light which is decomposed into the third-level SSP light and the third-level SSS light, and the third-level SSP light is decomposed into the fourth-level SSPP light and fourth-level SSPS light, and the fourth-level SSPS light escapes to the outside through the linear polarization plate. In this embodiment, the third-level SSS light and the fourth-level SSPP light will be not taken into account.

Secondly transmission of the first-level P light will be described below.

Furthermore, since the slow axis of the λ/2 phase-difference plate is parallel to the slow axis of the λ/4 phase-difference plate, the first-level P light is turned into right-rotated circularly polarized light after passing the λ/4 phase-difference plate; the right-rotated circularly polarized light is reflected by the metal electrode into left-rotated circularly polarized light after passing the metal electrode layer, the reflected left-rotated circularly polarized light propagates in a reversed route to the original propagation route, and the left-rotated circularly polarized light is turned into S light after passing the λ/4 phase-difference plate; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the first-level P light is decomposed will be defined as second-level PP light and second-level PS light.

Furthermore, the second-level PP light can escape to the outside through the brightness enhancement film and the linear polarization plate; the second-level PS light is reflected by the brightness enhancement film, the reflected S light propagates in a reversed route to the original propagation route, the S light propagating in the reversed route passes the λ/2 phase-difference plate, and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the second-level PS light is decomposed will be defined as third-level PSP light and third-level PSS light.

Furthermore, since the slow axis of the λ/2 phase-difference plate is parallel to the slow axis of the λ/4 phase-difference plate, the third-level PSP light is turned into right-rotated circularly polarized light after passing the λ/4 phase-difference plate; the right-rotated circularly polarized light is reflected by the metal electrode into left-rotated circularly polarized light after passing the metal electrode layer, the reflected left-rotated circularly polarized light propagates in a reversed route to the original propagation route, and the left-rotated circularly polarized light is turned into S light after passing the λ/4 phase-difference plate; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the third-level PSP light is decomposed will be defined as fourth-level PSPP light and fourth-level PSPS light.

Furthermore, the fourth-level PSPS light can escape to the outside through the brightness enhancement film and the linear polarization plate.

Since the first-level P light is decomposed into the second-level PP light which escapes to the outside through the linear polarization plate, and the second-level PS light which is decomposed into the third-level PSP light and the third-level PSS light, where the third-level PSP light is decomposed into the fourth-level PSPP light, and the fourth-level PSPS light which escapes to the outside through the linear polarization plate. In this embodiment, the third-level PSS light and the fourth-level PSPP light will be not taken into account.

The reflectivity of outside natural light being reflected will be described below with reference to FIG. 13.

After natural light is incident onto the linear polarization plate, P light parallel to the absorption axis of the linear polarization plate among the natural light passes the linear polarization plate, and S light perpendicular to the absorption axis of the linear polarization plate among the natural light is absorbed by the linear polarization plate; since the optical transmittivity of the linear polarization plate is 48%, the output amount of the P light passing the linear polarization plate is 48% of the natural light; since the optical transmittivity of the brightness enhancement film is 96%, the output amount of the P light passing the brightness enhancement film is 48%*96% of the natural light; and the P light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the light is turned after passing the λ/2 phase-difference plate will be defined as first-level P light and first-level S light, where the component of the first-level S light is 48%*96%*95%*sin 2θ, and the component of the first-level P light is 48%*96%*95%*cos 2θ.

For the sake of a clear description, firstly transmission of the first-level S light will be described below.

Furthermore, since the slow axis of the λ/2 phase-difference plate is parallel to the slow axis of the λ/4 phase-difference plate, the first-level S light is turned into left-rotated circularly polarized light after passing the λ/4 phase-difference plate; since the optical transmittivity of the λ/4 phase-difference plate is 98%, the output amount of the left-rotated circularly polarized light is 48%*96%*95%*sin 2θ*98% of the natural light; the left-rotated circularly polarized light is reflected by the metal electrode into right-rotated circularly polarized light after passing the metal electrode layer, and the reflected right-rotated circularly polarized light propagates in a reversed route to the original propagation route; since the reflectivity of the metal electrode is 40%, the output amount of the right-rotated circularly polarized light is 48%*96%*95%*sin 2θ*98%*40% of the natural light; the right-rotated circularly polarized light is turned into P light after passing the λ/4 phase-difference plate; since the optical transmittivity of the λ/4 phase-difference plate is 98%, the output amount of the P light is 48%*96%*95%*sin 2θ*98%*40%*98% of the natural light; and the P light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the first-level S light is decomposed will be defined as second-level SP light and second-level SS light. Since the optical transmittivity of the λ/2 phase-difference plate is 95%, the output amount of the second-level SP light is 48%*96%*95%*sin 2θ*98%*40%*98%*cos 2θ*95% of the natural light, and the output amount of the second-level SS light is 48%*96%*95%*sin 2θ*98%*40%*98%*sin 2θ*95% of the natural light.

Furthermore, the second-level SP light can escape to the outside through the brightness enhancement film and the linear polarization plate; and since the optical transmittivity of the brightness enhancement film is 96% and the optical transmittivity of the linear polarization plate is 98%, the output amount of the second-level SP light is 48%*96%*95%*sin 2θ*98%*40%*cos 2θ*98%*95%*96%*98%=1.5%*sin 2θ*cos 2θ of the natural light.

The second-level SS light is reflected by the brightness enhancement film, and the reflected S light propagates in a reversed route to the original propagation route; since the reflectivity of the brightness enhancement film is 48%, the output amount of the reflected S light is 48%*96%*95%*sin 2θ*98%*40%*98%*sin 2θ*95%*48% of the natural light; and the S light propagating in the reversed route passes the θ/2 phase-difference plate, and the S light is turned into P light and S light after passing the θ/2 phase-difference plate due to the θ angle between the absorption axis of the linear polarization plate and the slow axis of the λ/2 phase-difference plate. In this embodiment, for the sake of a clear description, the P light and the S light into which the second-level SS light is decomposed will be defined as third-level SSP light and third-level SSS light. Since the optical transmittivity of the λ/2 phase-difference plate is 95%, the output amount of the third-level SSP light is 48%*96%*95%*sin 2θ*98%*40%*98%*sin 2θ*95%*48%*95%*sin 2θ of the natural light.

Furthermore, since the slow axis of the λ/2 phase-difference plate is parallel to the slow axis of the λ/4 phase-difference plate, the third-level SSP light is turned into right-rotated circularly polarized light after passing the λ/4 phase-difference plate; since the optical transmittivity of the λ/4 phase-difference plate is 98%, the output amount of the right-rotated circularly polarized light is 48%*96%*95%*sin 2θ*98%*40%*98%*sin 2θ*95%*48%*95%*sin 2θ*98% of the natural light; the right-rotated circularly polarized light is reflected by the metal electrode into left-rotated circularly polarized light after passing the metal electrode layer, the reflected left-rotated circularly polarized light propagates in a reversed route to the original propagation route, and since the reflectivity of the metal electrode is 40%, the output amount of the left-rotated circularly polarized light is 48%*96%*95%*sin 2θ*98%*40%*98%*sin 2θ*95%*48%*95%*sin 2θ*98%*40% of the natural light; the left-rotated circularly polarized light is turned into S light after passing the λ/4 phase-difference plate; since the optical transmittivity of the λ/4 phase-difference plate is 98%, the output amount of the S light is 48%*96%*95%*sin 2θ*98%*40%*98%*sin 2θ*95%*48%*95%*sin 2θ*98%*40%*98% of the natural light; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the third-level SSP light is decomposed will be defined as fourth-level SSPP light and fourth-level SSPS light, and the output amount of the fourth-level SSPP light is 48%*96%*95%*sin 2θ*98%*40%*98%*sin 2θ*95%*48%*95%*sin 2θ*98%*40%*98%*95%*sin 2θ of the natural light.

Furthermore, the fourth-level SSPS light can escape to the outside through the brightness enhancement film and the linear polarization plate. With the 96% optical transmittivity of the brightness enhancement film and the 98% optical transmittivity of the linear polarization plate, the output amount of the fourth-level SSPP light is 48%*96%*95%*sin 2θ*98%*40%*98%*sin 2θ*95%*48%*95%*sin 2θ*98%*40%*98%*95%*sin 2θ*96%*98%=0.25%*(sin 2θ)⁴ of the natural light.

Since the first-level S light is decomposed into the second-level SP light which escapes to the outside through the linear polarization plate, and the second-level SS light which is decomposed into the third-level SSP light and the third-level SSS light, where the third-level SSP light is decomposed into the fourth-level SSPP light, and the fourth-level SSPS light which escapes to the outside through the linear polarization plate. In this embodiment, the third-level SSS light and the fourth-level SSPP light will be not taken into account.

Secondly transmission of the first-level P light will be described below.

Furthermore, since the slow axis of the λ/2 phase-difference plate is parallel to the slow axis of the λ/4 phase-difference plate, the first-level P light is turned into right-rotated circularly polarized light after passing the λ/4 phase-difference plate; since the optical transmittivity of the λ/4 phase-difference plate is 98%, the output amount of the right-rotated circularly polarized light is 48%*96%*95%*sin 2θ*98% of the natural light; the right-rotated circularly polarized light is reflected by the metal electrode into left-rotated circularly polarized light after passing the metal electrode layer, and the reflected left-rotated circularly polarized light propagates in a reversed route to the original propagation route; since the reflectivity of the metal electrode is 40%, the output amount of the left-rotated circularly polarized light is 48%*96%*95%*sin 2θ*98%*40% of the natural light; the left-rotated circularly polarized light is turned into S light after passing the λ/4 phase-difference plate; since the optical transmittivity of the λ/4 phase-difference plate is 98%, the output amount of the S light is 48%*96%*95%*sin 2θ*98%*40%*98% of the natural light; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the first-level P light is decomposed will be defined as second-level PP light and second-level PS light. Since the optical transmittivity of the λ/2 phase-difference plate is 95%, the output amount of the second-level PP light is 48%*96%*95%*sin 2θ*98%*40%*98%*cos 2θ*95% of the natural light, and the output amount of the second-level PS light is 48%*96%*95%*sin 2θ*98%*40%*98%*sin 2θ*95% of the natural light.

Furthermore, the second-level PP light can escape to the outside through the brightness enhancement film and the linear polarization plate; and since the 96% optical transmittivity of the brightness enhancement film and the 98% optical transmittivity of the linear polarization plate, the output amount of the second-level PP light is 48%*96%*95%*sin 2θ*98%*40%*cos 2θ*98%*95%*96%*98%=1.5%*sin 2θ*cos 2θ of the natural light.

The second-level PS light is reflected by the brightness enhancement film, and the reflected S light propagates in a reversed route to the original propagation route; since the reflectivity of the brightness enhancement film is 48%, the output amount of the reflected S light is 48%*96%*95%*sin 2θ*98%*40%*98%*sin 2θ*95%*48% of the natural light; and the S light propagating in the reversed route passes the λ/2 phase-difference plate, and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the second-level PS light is decomposed will be defined as third-level PSP light and third-level PSS light. Since the optical transmittivity of the λ/2 phase-difference plate is 95%, the output amount of the third-level PSP light is 48%*96%*95%*sin 2θ*98%*40%*98%*sin 2θ*95%*48%*95%*sin 2θ of the natural light.

Furthermore, since the slow axis of the λ/2 phase-difference plate is parallel to the slow axis of the λ/4 phase-difference plate, the third-level PSP light is turned into right-rotated circularly polarized light after passing the λ/4 phase-difference plate; since the optical transmittivity of the λ/4 phase-difference plate is 98%, the output amount of the right-rotated circularly polarized light is 48%*96%*95%*sin 2θ*98%*40%*98%*sin 2θ*95%*48%*95%*sin 2θ*98% of the natural light; the right-rotated circularly polarized light is reflected by the metal electrode into left-rotated circularly polarized light after passing the metal electrode layer, the reflected left-rotated circularly polarized light propagates in a reversed route to the original propagation route, and since the reflectivity of the metal electrode is 40%, the output amount of the left-rotated circularly polarized light is 48%*96%*95%*sin 2θ*98%*40%*98%*sin 2θ*95%*48%*95%*sin 2θ*98%*40% of the natural light; the left-rotated circularly polarized light is turned into S light after passing the λ/4 phase-difference plate; since the optical transmittivity of the λ/4 phase-difference plate is 98%, the output amount of the S light is 48%*96%*95%*sin 2θ*98%*40%*98%*sin 2θ*95%*48%*95%*sin 2θ*98%*40%*98% of the natural light; and the S light is turned into P light and S light after passing the λ/2 phase-difference plate due to the θ angle between the absorption axis of the linear polarization plate and the slow axis of the λ/2 phase-difference plate. In this embodiment, for the sake of a clear description, the P light and the S light into which the third-level PSP light is decomposed will be defined as fourth-level PSPP light and fourth-level PSPS light, and the output amount of the fourth-level PSPP light is 48%*96%*95%*sin 2θ*98%*40%*98%*sin 2θ*95%*48%*95%*sin 2θ*98%*40%*98%*95%*sin 2θ of the natural light.

Furthermore, the fourth-level PSPP light can escape to the outside through the brightness enhancement film and the linear polarization plate. With the 96% optical transmittivity of the brightness enhancement film and the 98% optical transmittivity of the linear polarization plate, the output amount of the fourth-level PSPP light is 48%*96%*95%*sin 2θ*98%*40%*98%*sin 2θ*95%*48%*95%*sin 2θ*98%*40%*98%*95%*sin 2θ*96%*98%=0.25%*(sin 2θ)⁴ of the natural light.

Since the first-level P light is decomposed into the second-level PP light which escapes to the outside through the linear polarization plate, and the second-level PS light which is decomposed into the third-level PSP light and the third-level PSS light, where the third-level PSP light is decomposed into the fourth-level PSPP light, and the fourth-level PSPS light which escapes to the outside through the linear polarization plate. In this embodiment, the third-level PSS light and the fourth-level PPPP light will be not taken into account.

It can be determined from the analysis above that the output amount of the natural light includes the second-level PP, fourth-level PSPS, second-level SP and fourth-level SSPS, the total amount of which is 48%*96%*95%*sin 2θ*98%*40%*cos 2θ*98%*95%*96%*98%+48%*96%*95%*cos 2θ*98%*40%*sin 2θ*98%*95%*96%*98%+48%*96%*95%*sin 2θ*98%*40%*sin 2θ*98%*95%

*96% *95%*sin 2θ*98%*40%*98%*95%*sin 2θ*96% *98%+48%*96%*95%*cos2θ*98%*40%*cos 2θ*98%*95%*cos 2θ*96%*95%*98%*40%*98% *95%*cos 2θ*96%*98%=2*0.25%*(sin 2θ)4+2*1.5%*sin 2θ*cos 2θ=5%+0.15 sin 4θ

It can be determined from the analysis above that the output amount (reflectivity) of the outside natural light is at least 5% at θ=45°, so the output amount of the outside natural light is dependent upon the angle of the absorption axis of the linear polarization plate in the optical member, and the lowest reflectivity can be available at the 45° angle of the absorption axis of the linear polarization plate.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

What is claimed is:

1. An optical member, comprising:
   a metal electrode, a λ/4 phase-difference plate and a linear polarization plate sequentially arranged in this order;
   a λ/2 phase-difference plate and a brightness enhancement film arranged between the λ/4 phase-difference plate and the linear polarization plate;
   wherein:
   there is an angle between an absorption axis of the linear polarization plate and a polarization axis of the brightness enhancement film;
   there is an angle between the polarization axis of the brightness enhancement film and a slow axis of the λ/2 phase-difference plate;
   the slow axis of the λ/2 phase-difference plate is parallel to a slow axis of the λ/4 phase-difference plate; and
   an angle between the absorption axis of the linear polarization plate and the slow axis of the λ/2 phase-difference plate is in a range from 30° to 45°.

2. The optical member according to claim 1, wherein the λ/2 phase-difference plate is arranged between the λ/4 phase-difference plate and the brightness enhancement film.

3. The optical member according to claim 1, wherein the λ/2 phase-difference plate is arranged between the brightness enhancement film and the linear polarization plate.

4. The optical member according to claim 1, wherein the λ/2 phase-difference plate has an optical absorptivity of 5%, and the λ/4 phase-difference plate has an optical absorptivity of 2%.

5. The optical member according to claim 1, wherein the brightness enhancement film has an optical absorptivity of 4%, a transmittivity of 48%, and a reflectivity of 48%.

6. The optical member according to claim 1, wherein a surface of the metal electrode has a reflectivity of 40% to 50%.

7. The optical member according to claim 1, wherein the angle between the slow axis of the λ/2 phase-difference plate and the polarization axis of the brightness enhancement film is in a range from 30° to 45°.

8. The optical member according to claim 2, wherein the angle between the slow axis of the λ/2 phase-difference plate and the polarization axis of the brightness enhancement film is in a range from 30° to 45°.

9. The optical member according to claim 3, wherein the angle between the slow axis of the λ/2 phase-difference plate and the polarization axis of the brightness enhancement film is in a range from 30° to 45°.

10. The optical member according to claim 1, wherein the brightness enhancement film is a dual brightness enhancement film.

11. An OLED display device comprising an optical member, the optical member comprising:
    a metal electrode, a λ/4 phase-difference plate and a linear polarization plate sequentially arranged in this order;
    a λ/2 phase-difference plate and a brightness enhancement film arranged between the λ/4 phase-difference plate and the linear polarization plate;
    wherein:
    there is an angle between an absorption axis of the linear polarization plate and a polarization axis of the brightness enhancement film;
    there is an angle between the polarization axis of the brightness enhancement film and a slow axis of the λ/2 phase-difference plate;
    the slow axis of the λ/2 phase-difference plate is parallel to a slow axis of the λ/4 phase-difference plate;
    the metal electrode has a first side facing the λ/4 phase-difference plate and an opposite side, an OLED light-emitting layer is arranged at the opposite side of the metal electrode; and
    an angle between the absorption axis of the linear polarization plate and the slow axis of the λ/2 phase-difference plate is in a range from 30° to 45°.

12. The OLED display device according to claim 11, wherein the λ/2 phase-difference plate is arranged between the λ/4 phase-difference plate and the brightness enhancement film.

13. The OLED display device according to claim 11, wherein the λ/2 phase-difference plate is arranged between the brightness enhancement film and the linear polarization plate.

14. The OLED display device according to claim 11, wherein the angle between the slow axis of the λ/2 phase-difference plate and the polarization axis of the brightness enhancement film is in a range from 30° to 45°.

15. The optical member according to claim 1, wherein:
    the metal electrode has a first side facing the λ/4 phase-difference plate and an opposite side, an OLED light-emitting layer is arranged at the opposite side of the metal electrode.

* * * * *